US012713867B2

(12) United States Patent
Kim et al.

(10) Patent No.: US 12,713,867 B2
(45) Date of Patent: Aug. 18, 2026

(54) SUBSTRATE TREATING APPARATUS AND SUBSTRATE TREATING METHOD

(71) Applicant: SEMES CO., LTD., Chungcheongnam-do (KR)

(72) Inventors: Kwang Sup Kim, Chungcheongnam-do (KR); Seung Un Oh, Chungcheongnam-do (KR); Shin Hwa Kang, Gyeonggi-do (KR); Sang Hyeon Ryu, Gyeonggi-o (KR); Young Ho Park, Incheon (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 773 days.

(21) Appl. No.: 18/068,675

(22) Filed: Dec. 20, 2022

(65) Prior Publication Data

US 2023/0207349 A1 Jun. 29, 2023

(30) Foreign Application Priority Data

Dec. 28, 2021 (KR) ........................ 10-2021-0189862

(51) Int. Cl.
*H10P 72/00* (2026.01)
*B23K 26/08* (2014.01)
*B23K 103/00* (2006.01)

(52) U.S. Cl.
CPC ...... *H10P 72/0436* (2026.01); *B23K 26/0823* (2013.01); *B23K 26/0869* (2013.01); *B23K 2103/56* (2018.08)

(58) Field of Classification Search
CPC .......... H01L 21/67115; B23K 26/0823; B23K 26/0869; B23K 2103/56
USPC .................................................... 156/345.15
See application file for complete search history.

(56) References Cited

U.S. PATENT DOCUMENTS

| | | | | |
|---|---|---|---|---|
| 11,679,447 | B2 | 6/2023 | Park | |
| 2015/0047677 | A1* | 2/2015 | Muramoto | H01L 21/67051 392/416 |
| 2016/0293421 | A1* | 10/2016 | Harada | H01L 21/76841 |
| 2020/0346299 | A1* | 11/2020 | Park | B23K 26/032 |

(Continued)

FOREIGN PATENT DOCUMENTS

| | | | |
|---|---|---|---|
| CN | 111843224 | A | 10/2020 |
| JP | 2021-171804 | A | 11/2021 |

(Continued)

OTHER PUBLICATIONS

Korean Office Action issued on Mar. 26, 2024 in corresponding KR Patent Application No. 10-2021-0189862, with English translation.

(Continued)

*Primary Examiner* — Charlee J. C. Bennett
(74) *Attorney, Agent, or Firm* — Carter, DeLuca & Farrell LLP

(57) ABSTRACT

Disclosed is a substrate treating apparatus. The substrate treating apparatus includes a body including an irradiation end, from which laser light is irradiated, a shaft coupled to the body, and a driver that supplies power to the shaft, the heating unit is swung about an axis of the shaft, and the controller moves the irradiation end of the heating unit to a target location on a substrate by adjusting a rotation angle of the heating unit and a rotation angle of the support unit.

17 Claims, 21 Drawing Sheets

(56) References Cited

U.S. PATENT DOCUMENTS

| | | | | |
|---|---|---|---|---|
| 2022/0390848 | A1* | 12/2022 | Choi | G03F 7/30 |
| 2023/0203669 | A1* | 6/2023 | Kang | C23F 1/08<br>156/345.15 |
| 2023/0205091 | A1* | 6/2023 | Yoon | H01L 21/67051<br>425/174.4 |
| 2023/0207324 | A1* | 6/2023 | Son | H01L 21/67051<br>438/463 |
| 2023/0207351 | A1* | 6/2023 | Oh | H01L 21/6708<br>392/418 |

FOREIGN PATENT DOCUMENTS

| | | | |
|---|---|---|---|
| KR | 10-2005-0025704 | A | 3/2005 |
| KR | 10-2018-0020880 | A | 2/2018 |
| KR | 10-2019-0037379 | A | 4/2019 |
| KR | 10-2021-0033907 | A | 3/2021 |

OTHER PUBLICATIONS

Chinese Office Action issued by the China National Intellectual Property Administration on Apr. 29, 2026 in corresponding CN Patent Application No. 202211698342.6, with English translation.

* cited by examiner 1
400
322
300
320
324
20
200
124
120
14
122
12
10
CR
220
30
X
Y
Z

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2021-0189862 filed on Dec. 28, 2021, in the Korean Intellectual Property Office, the entire contents of which are hereby incorporated by reference.

BACKGROUND

Embodiments of the inventive concept described herein relate to a substrate treating apparatus and a substrate treating method.

To manufacture a semiconductor device, various processes, such as photographing, etching, ashing, injection of ions, and deposition of thin films, are performed on a substrate, such as a wafer. In the processes, various treatment liquids and treatment gases are used. Furthermore, a process of drying the substrate is performed to remove the treatment liquid used to treat the substrate from the substrate.

The photographing process of forming a pattern on the wafer includes an exposure process. The exposure operation is a preliminary operation for directly shaving off a semiconductor material attached on the wafer into a pattern. The exposure process may have various purposes, such as formation of a pattern for etching and formation of a pattern for injection of ions. In the exposure process, a pattern is drawn on the wafer with light by using a mask that is a kind of frame. When light is directly exposed to a semiconductor material on the wafer, for example, a resist on the wafer, chemical properties of the resist are changed according to a pattern due to the light and the mask. When a development liquid is supplied to the resist, the chemical properties of which are changed according to the pattern, a pattern is formed on the wafer.

To precisely perform the exposure process, the pattern formed on the mask has to be precisely manufactured. To identify whether the pattern has a desired shape and whether the pattern is formed precisely, an operator inspects the formed pattern by using inspection equipment, such as a scanning electronic microscope (SEM). However, a large number of patterns are formed in one mask. That is, to inspect one mask, much time is taken to inspect all of a large number of patterns.

Accordingly, a monitoring pattern that may represent one pattern group including a plurality of pattern is formed in the mask. Furthermore, an anchor pattern that may represent a plurality of pattern groups is formed in the mask. An operator may estimate qualities of the patterns formed in the mask through inspection of the anchor pattern. Furthermore, the operator may estimate qualities of the patterns included in one pattern group through inspection of the monitoring pattern.

In this way, through the monitoring pattern and the anchor pattern formed in the mask, the operator may effectively shorten a time for inspection of the mask. However, to increase a precision of inspection of the mask, it is preferable that line widths of the monitoring pattern and the anchor pattern are the same.

When etching is performed to make the line widths of the monitoring pattern and the anchor pattern the same, the patterns may be excessively etched. For example, a difference between an etching rate for the line width of the monitoring pattern and an etching rate for the line width of the anchor pattern may occur several times, and in a process of repeatedly etching the monitoring pattern and/or the anchor pattern to reduce the differences, over-etching may be generated in the line width of the monitoring pattern and the line width of the anchor pattern. When an etching process is precisely performed to minimize over-etching, much time is taken in the etching process. Accordingly, a line width correcting process for precisely connecting the line widths of the patterns formed in the mask is additionally performed.

FIG. 1 shows normal distributions of a first line width CDP1 of the monitoring pattern and a second line width CDP2 the anchor pattern of a mask before, among the mask manufacturing processes, a line width correcting process that is a final operation is performed. Furthermore, the first line width CDP1 and the second line width CDP2 are sizes that are smaller than a target line width. Further, as may be seen with reference to FIG. 1, line widths (critical dimensions) of the monitoring pattern and the anchor pattern have a deviation on purpose before the line width correcting process is performed. Furthermore, the line widths of the two patterns are made to be the same by additionally etching the anchor pattern in the line width correcting process.

In the line width correcting process, an etching chemical is supplied onto the substrate such that the first line width CDP1 and the second line width CDP2 become the target line width. However, when the etching chemical is uniformly supplied onto the substrate, even though any one of the first line width CDP1 and the second line width CDP2 may reach the target line width, it is difficult for the other one of the first line width CDP1 and the second line width CDP2 to reach the target line width. Furthermore, a deviation between the first line width CDP1 and the second line width CDP2 is not reduced.

SUMMARY

Embodiments of the inventive concept provide a substrate treating apparatus that may efficiently treat a substrate, and a substrate treating method.

Embodiments of the inventive concept provide a substrate treating apparatus that may make line widths of pattern formed on a substrate uniform, and a substrate treating method.

Embodiments of the inventive concept provide a substrate treating apparatus that may move laser light to a desired target location on a substrate, and a substrate treating method.

Embodiments of the inventive concept provide a substrate treating apparatus that uses a laser module that is swung and a substrate support unit that is rotated to allow laser light to be precisely irradiated to a target location, and a substrate treating method.

The problems that are to be solved by the inventive concept are not limited to the above-mentioned problems, and the unmentioned problems will be clearly understood by those skilled in the art to which the inventive concept pertains from the specification and the accompanying drawings.

An embodiment of the inventive concept provides a substrate treating apparatus. The substrate treating apparatus includes a body including an irradiation end, from which laser light is irradiated, a shaft coupled to the body, and a driver that supplies power to the shaft, the heating unit is swung about an axis of the shaft, and the controller moves the irradiation end of the heating unit to a target location on a substrate by adjusting a rotation angle of the heating unit and a rotation angle of the support unit.

The target location may include an ideal target location, at which the target location is located when a center of the substrate and a center of the support unit coincide with each other, and an actual target location, at which the target location is located when the center of the substrate and the center of the support unit do not coincide with each other, the controller may calculate an error value between the ideal target location and the actual target location, and the controller may calculate a coordinate of the actual target location by applying the calculated error value to the actual target location.

The controller may derive an imaginary first circle, a radius of which is a distance between the center of the support unit and the calculated coordinate of the actual target location, and the controller may calculate a first rotation locus of the imaginary first circle.

The controller may derive an imaginary second circle, a radius of which is a length of the body of the heating unit, and the controller may calculate a second rotation locus of the imaginary second circle.

The controller determines a point, at which the first rotation locus and the second rotation locus meet each other, as a final movement location.

A point, at which a rotation angle of the heating unit is small, may be determined as the final movement location when the first rotation locus and the second rotation locus meet each other at a plurality of points.

The controller may calculate a first rotation angle, by which the irradiation end is moved to the final movement location, and the controller may swing the heating unit by the first rotation angle.

The controller may calculate a second rotation angle, by which the support unit is to be rotated, to move the actual target location formed on the substrate to the final movement location, and the controller may rotate the support unit by the second rotation angle.

The support unit may be rotatable in the clockwise direction or the counterclockwise direction, and the second rotation angle may be determined by an angle having a minimum vale according to a rotation direction of the support unit.

A first pattern, and a second pattern formed at a location that is different from that of the first pattern may be formed on the substrate, and the target location may be a location of the second pattern.

An embodiment of the inventive concept provides a substrate treating method. The substrate treating method includes an arrangement operation of aligning a target location formed on a substrate supported by a support unit and an irradiation end of a heating unit that irradiates laser light, and a treatment operation of treating the substrate by irradiating the laser light to the target location on the substrate supported by the support unit, by the heating unit, and the arrangement operation includes aligning a center of the substrate and a center of the support unit by correcting, when an ideal target location, at which the target location is located, when the center of the substrate and the center of the support unit coincide with each other and an actual target location, at which the target location is actually located, do not coincide with each other, an error value between the ideal target location and the actual target location.

The arrangement operation may include calculating a coordinate of the actual target location by applying the error value to the actual target location.

The arrangement operation may include calculating a first rotation locus having an imaginary first circle, a radius of which is a distance between the center of the support unit and the coordinate of the actual target location, and a second rotation locus having an imaginary second circle, a radius of which is a length of the heating unit, and the controller may determine a point, at which the first rotation locus and the second rotation locus meet each other, as a final movement location.

The support unit may be rotated such that the actual target location is moved to the final movement location.

The heating unit may be swung such that the irradiation end is moved to the final movement location.

The support unit may be rotatable in the clockwise direction or the counterclockwise direction, the support unit may be rotated by a first rotation angle, and the first rotation angle may be an angle having a minimum value according to a rotation direction of the support unit.

A point, at which a rotation angle of the heating unit is small, may be determined as the final movement location when the first rotation locus and the second rotation locus meet each other at a plurality of points.

The substrate may have a first pattern and a second pattern, which are formed at different location, and the target location may be a location of the second pattern.

An embodiment of the inventive concept provides a substrate treating method. The substrate treating method includes an arrangement operation of aligning a target location formed on a substrate supported by a support unit and an irradiation end of a heating unit that irradiates laser light, and a treatment operation of treating the substrate by irradiating the laser light to the target location on the substrate supported by the support unit, by the heating unit, the target location includes an ideal target location, at which the target location is located when a center of the substrate and a center of the support unit coincide with each other, and an actual target location, at which the target location is actually located, and the arrangement operation includes calculating a coordinate of the actual target location by applying an error value between the actual target location and the ideal target location to the actual target location, calculating a first rotation locus, a radius of which is a distance between the actual target location and the center of the support unit, calculating a second rotation locus, a radius of which is a length of the heating unit, deriving a coordinate of a final movement location that is a point, at which the first rotation locus and the second rotation locus meet each other, and moving the irradiation end of the heating unit and the actual target location to the final movement location.

The heating unit may include a body including an irradiation end, a shaft coupled to the body, and a driver that supplies power to the shaft, the heating unit may be swung about an axis of the shaft to move the irradiation end to the final movement location, and the support unit may be rotated in the clockwise direction or the counterclockwise direction to move the actual target location to the final movement location.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 5 is a view of the liquid treatment chamber of FIG. 4, when viewed from the top;

DETAILED DESCRIPTION

Figure 1:
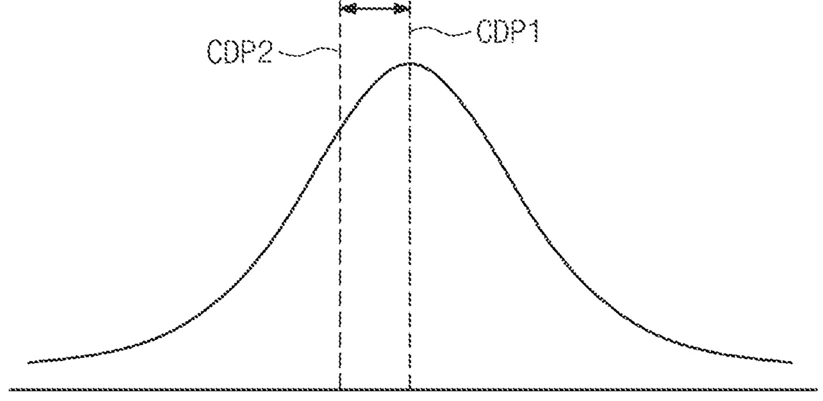
FIG. 1 is a view illustrating a normal distribution of a line width of a monitoring pattern and a line width of an anchor pattern.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Furthermore, in a detailed description of the preferred embodiment of the inventive concept, a detailed description of related known functions or configurations will be omitted when they may make the essence of the inventive concept unclear. In addition, the same reference numerals are used for parts that perform similar functions and operations throughout the drawings.

The expression of 'including' some components may mean that another component may be further included without being excluded unless there is a particularly contradictory description. In detail, the terms "including" and "having" are used to designate that the features, the numbers, the steps, the operations, the components, the parts, or combination thereof described in the specification are present, and may be understood that one or more other features, numbers, step, operations, components, parts, or combinations thereof may be added.

The terms of a singular form may include plural forms unless otherwise specified. Furthermore, in the drawings, the shapes and sizes of the components may be exaggerated for clearer description.

The terms such as first and second may be used to describe various components, but the components are not limited to the terms. The terms may be used only for the purpose of distinguishing one component from another component. For example, while not deviating from the scope of the inventive concept, a first component may be named a second component, and similarly, the second component may be named the first component.

When it is mentioned that one component is "connected to" or "electrically connected to" another component, it should be understood that the first component may be directly connected or electrically connected to the second component but a third component may be provided therebetweeen. On the other hand, when it is mentioned that a component is "directly connected to" or "directly electrically connected to" another component, it should be understood that a third component is not present between them. It should be construed that other expressions that describe the relationships between components, such as "between", "directly between", "adjacent to", and "directly adjacent to" may have the same purpose.

In addition, unless defined otherwise, all terms used herein, including technical or scientific terms, have the same meanings as those generally understood by those skilled in the art to which the inventive concept pertains. The terms defined in the generally used dictionaries should be construed as having the meanings that coincide with the meanings of the contexts of the related technologies, and should not be construed as ideal or excessively formal meanings unless clearly defined in the specification of the present disclosure.

Hereinafter, embodiments of the inventive concept will be described with reference to FIGS. 2 to 23.

Figure 2:
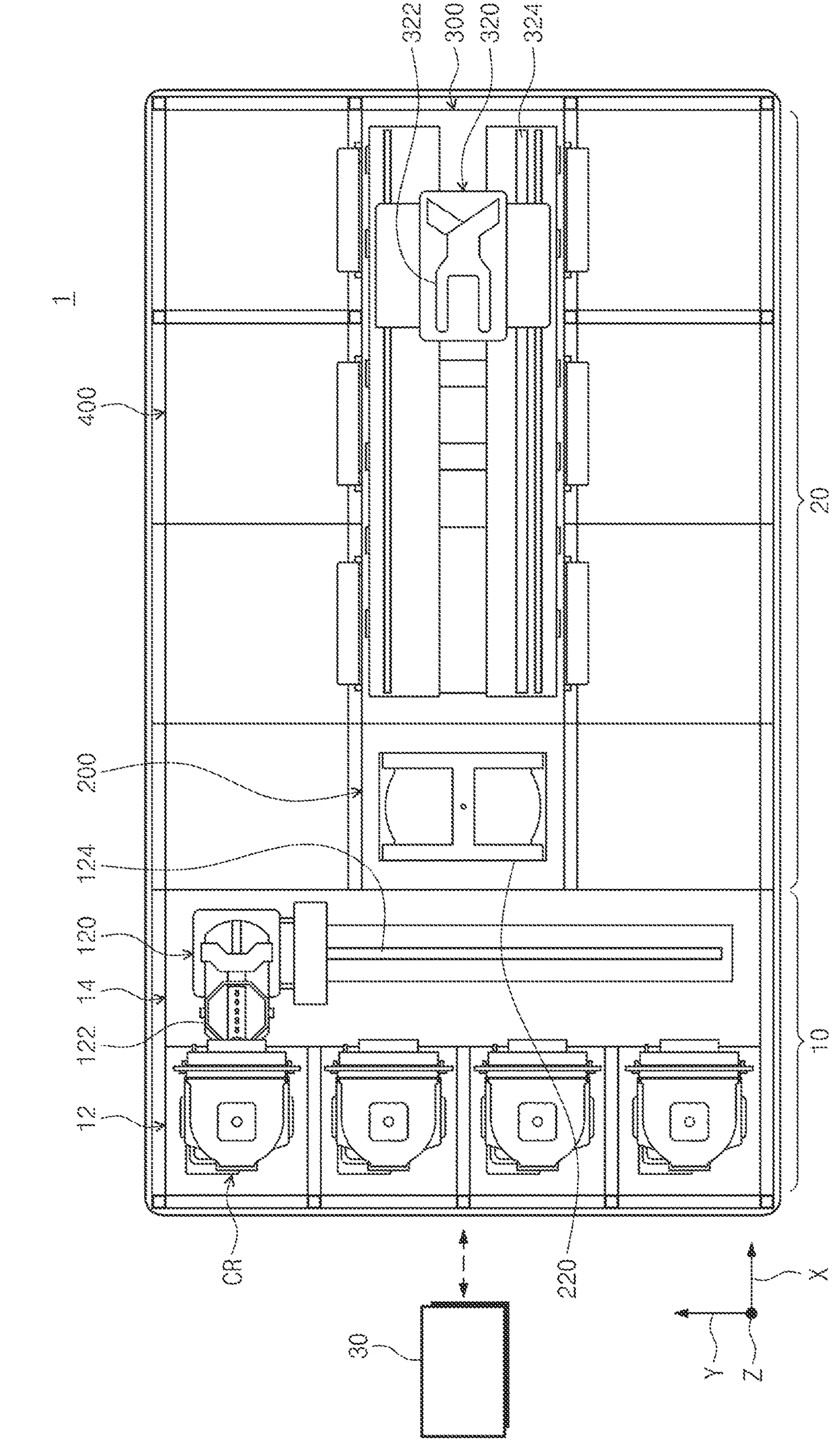
FIG. 2 is a plan view schematically illustrating a substrate treating apparatus according to an embodiment of the inventive concept.

FIG. 2 is a plan view schematically illustrating a substrate treating apparatus according to an embodiment of the inventive concept.

Referring to FIG. 2, a substrate treating apparatus 1 includes an index module 10, a treatment module 20, and a controller 30. When viewed from a top, the index module 10 and the treatment module 20 are disposed along one direction. Hereinafter, a direction, in which the index module 10 and the treatment module 20 are disposed, will be referred to as a first direction "X", a direction that is perpendicular to the first direction "X" when viewed from the top will be referred to as a second direction "Y", and a direction that is perpendicular to both the first direction "X" and the second direction "Y" will be referred to as a third direction "Z".

The index module 10 may transfer a substrate "M" from a container CR, in which the substrate "M" is received, to the treatment module 20, and the substrate "M" completely treated by the treatment module 20 may be received in the container CR. A lengthwise direction of the index module 10 may be the second direction "Y". The index module 10 includes a plurality of load ports 12 and an index frame 14. The load ports 12 may be located on an opposite side of the treatment module 20 with respect to the index frame 14. The containers CR, in which the substrates "M" are received, may be positioned on the load port 12. A plurality of load ports 12 may be provided, and the plurality of load ports 12 may be disposed along the second direction "Y".

The container CR may be a closed container such as a front open unified pod (FOUP). The container CR may be positioned on the load port 12 by a feeding unit (not illustrated) such as an overhead transfer, an overhead conveyor, or an automatic guided vehicle, or an operator.

An index robot 120 may be provided in the index frame 14. A guide rail 124, a lengthwise direction of which is the second direction "Y", may be provided in the index frame 14. The index robot 120 may be moved on the guide rail 124. The index robot 120 includes a hand 122, on which the substrate "M" is positioned. The hand 122 may be configured to be moved forwards, moved rearwards, rotated about a third direction "Z", and moved along the third direction "Z". A plurality of hands may be provided to be spaced apart from each other in an upward/downward direction. The plurality of hands 122 may be moved independently from each other.

The controller 30 may control the substrate treating apparatus 1. Furthermore, the controller 30 may include a process controller including a microprocessor (computer) that executes control of the substrate treating apparatus 1, a keyboard for inputting commands to allow an operator to manage the substrate treating apparatus 1, a user interface including a display that visualizes and displays an operation situation of the substrate treating apparatus 1, and a memory unit for storing a control program for executing processing executed by the substrate treating apparatus 1 under a control of the process controller, or a program for executing processing, that is, a processing recipe in elements according to various data and processing conditions. Furthermore, the user interface and the memory unit may be connected to the process controller. The processing recipe may be memorized in a memory medium of a memory part. The memory medium may be a hard disk, or may be a transportable disk, such as a CD-ROM and a DVD, or a semiconductor memory, such as a flash memory.

The controller 30 may control the substrate treating apparatus 1 such that the substrate treating apparatus performs a substrate treating method that will be described below. For example, the controller 30 may control configurations provided to the liquid treatment chamber 400 to perform the substrate treating method that will be described below.

The treatment module 20 may include a buffer unit 200, a transfer frame 300, and a liquid treatment chamber 400. The buffer unit 200 may provide a space, in which the substrate "M" carried into the treatment module 20 and the substrate "M" carried out from the treatment module 20 temporarily stay. The transfer frame 300 may provide a space, in which the substrate "M" is transferred between the buffer unit 200 and the liquid treatment chamber 400. The liquid treatment chamber 400 may perform a liquid treatment process of liquid-treating the substrate "M" by supplying a liquid onto the substrate "M". The treatment module 20 may further include a drying chamber, and the drying chamber may perform a drying process of drying the substrate "M", on which the liquid treatment has been performed.

The buffer unit 200 is disposed between the index frame 14 and the transfer frame 300. The buffer unit 200 may be located at one end of the transfer frame 300. A plurality of substrates "M" may be stored in an interior of the buffer unit 200. Slots (not illustrated), in which the substrates "M" are positioned, may be provided in an interior of the buffer unit 200. A plurality of slots 2120 may be provided. A plurality of slots (not illustrated) may be spaced apart from each other along the third direction "Z". Accordingly, the plurality of substrates "M" stored in the buffer unit may be stacked while being spaced apart from each other in the third direction "Z".

A front face and a rear face of the buffer unit 200 may be opened. The front face may be a surface that faces the index module 10, and the rear face may be a surface that faces the transfer frame 300. The index robot 120 may approach the buffer unit 200 through the front face, and the transfer robot 320 that will be described below may approach the buffer unit 200 through the rear face.

The transfer frame 300 may be disposed such that a lengthwise direction thereof is the first direction "X". Liquid treatment chambers 400 may be disposed on opposite sides of the transfer frame 300. When the treatment module 20 includes a drying chamber, the liquid treatment chamber 400 may be disposed on one side of the transfer frame 300, and the drying chamber may be disposed on an opposite side of the transfer frame 300. The liquid treatment chamber 400 and the drying chamber may be disposed on sides of the transfer frame 300. The transfer frame 300 and the liquid treatment chambers 400 may be disposed along the second direction "Y". The transfer frame 300 and the drying chamber may be disposed along the second direction "Y". On one side or opposite sides of the transfer frame 300, the liquid treatment chambers 400 may be provided on an array of A by B (A and B are integers that are 1 or more than 1) along the first direction "X" and the third direction "Z". On an opposite side of the transfer frame 300, the drying chambers may be provided on an array of A by B (A and B are integers that are 1 or more than 1) along the first direction "X" and the third direction "Z".

The transfer frame 300 may include the transfer robot 320 and the transfer rail 324. The transfer robot 320 may transfer the substrate "M". The transfer robot 320 transfers the substrate "M" between the buffer unit 200 and the liquid treatment chamber 400. The transfer robot 320 transfers the substrate "M" between the buffer unit 200 and the liquid treatment chamber 400. The transfer robot 320 includes a transfer hand 322, on which the substrate "M" is positioned. The substrate "M" may be positioned on the transfer hand 322. The transfer hand 322 may be configured to be moved forwards, moved rearwards, rotated about the third direction "Z", and moved along the third direction "Z". A plurality of hands 332 may be provided to be spaced apart from each other in an upward/downward direction. The plurality of hands 322 may be moved forwards and rearwards independently.

The transfer rail 324 may be provided along the lengthwise direction of the transfer frame 300 in the transfer frame 300. As an example, a lengthwise direction of the transfer rail 324 may be provided along the first direction "X". The transfer robot 320 may be positioned on the transfer rail 324. The transfer robot 320 may be provided to be movable on the transfer rail 324.

Hereinafter, the substrate "M" treated in the liquid treatment chamber 400 will be described below.

Figure 3:
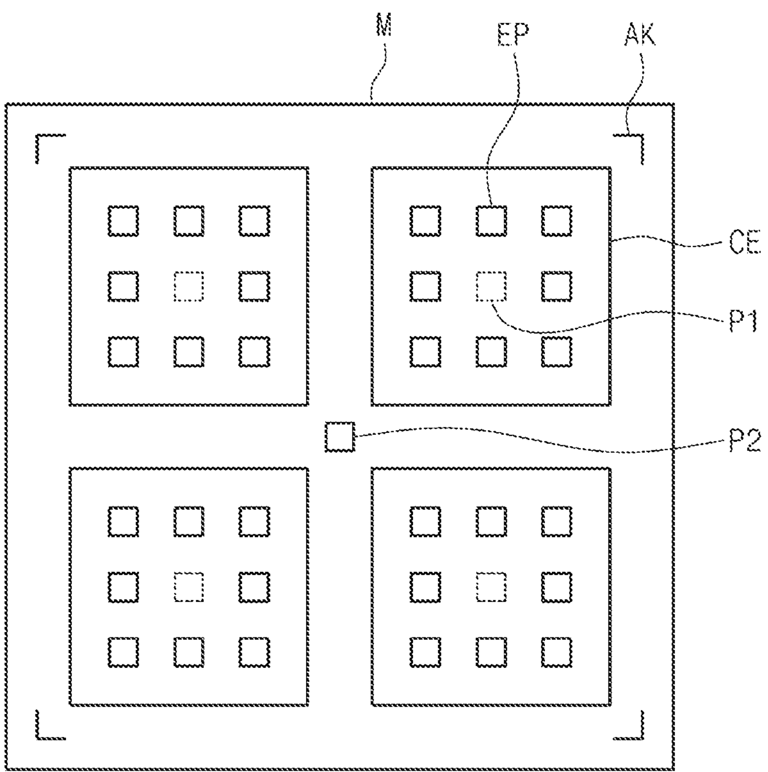
FIG. 3 is a view schematically illustrating an appearance of the substrate treated in the liquid treatment chamber of FIG. 2.

FIG. 3 is a view schematically illustrating an appearance of the substrate treated in the liquid treatment chamber of FIG. 2.

Referring to FIG. 3, an object that is to be treated in the liquid treatment chamber 400 may be a substrate of any one of a wafer, a glass, and a photo mask. For example, the substrate "M" treated in the liquid treatment chamber 400 may be a photo mask that is a frame used in an exposure process.

The substrate "M" may have a rectangular shape. The substrate "M" may be a photo mask that is a frame used during an exposure process. At least one reference mark AK may be marked on the substrate "M". For example, a plurality of reference marks AK may be formed corner areas of the substrate "M". As an example, the reference mark AK may include first to fourth reference marks. The reference marks AK may be referred to as alignment keys. The reference marks AK may be marks used when the substrate "M" is arranged. Furthermore, the reference marks AK may be marks used to derive location information of the substrate "M". For example, an image module 470 that will be described below may acquire an image by photographing the reference marks AK, and may transmit the acquired image to the controller 30. The controller 30 may detect a precise location of the substrate "M" by analyzing the image including the reference marks AK. Furthermore, the reference marks AK also may be used to recognize a location of the substrate "M" when the substrate "M" is transferred.

Cells CE may be formed on the substrate "M". The cells CE may include at least one cell CE. A plurality of indicator units 230 may be formed. A plurality of patterns may be formed in each of the cells CE. The patterns formed in each of the cells CE may be defined as one pattern group. The patterns formed in the cell CE may include an exposure pattern EP band a first pattern P1. The exposure pattern EP may be used to form an actual pattern on the substrate "M". Furthermore, the first pattern P1 may be a pattern that represents exposure patterns EP formed in one cell CE. Furthermore, when the plurality of cells CE are provided, a plurality of first patterns P1 may be provided. Furthermore, the plurality of first patterns P1 may be formed in the one cell CE. The first pattern P1 may have a shape, in which some of the exposure patterns EP are combined. The first pattern P1 also may be called a monitoring pattern. Furthermore, the first pattern P1 also may be called a critical dimension monitoring macro.

When an operator inspects the first pattern P1 through a scanning electronic microscope (SEM), qualities of shapes of the exposure patterns EP formed in one cell CE may be estimated. Furthermore, the first pattern P1 may be an inspection pattern. Furthermore, the first pattern P1 may be any one of the exposure patterns EP that participate in an actual exposure process. Furthermore, the first pattern P1 may be not only an inspection pattern but also an exposure pattern that participates in an actual exposure.

The second pattern P2 may be a pattern that represents exposure patterns EP formed in the entire substrate "M". For example, the second pattern P2 may have a shape, in which some of the first patterns P1 are combined.

When an operator inspects the second pattern P2 through a scanning electronic microscope (SEM), qualities of shapes of the exposure patterns EP formed in one substrate "M" may be estimated. Furthermore, the second pattern P2 may be an inspection pattern. Furthermore, the second pattern P2 may be an inspection pattern that does not participate in an actual exposure process. The second pattern P2 may be called an anchor pattern.

Hereinafter, the substrate treating apparatus provided to the liquid treatment chamber 400 will be described in detail. Furthermore, hereinafter, performance of a fine critical dimension correction process that is a final operation of a process of manufacturing a mask for an exposure process, in a treatment process performed in the liquid treatment chamber 400, will be described as an example.

The substrate "M" carried into the liquid treatment chamber 400 to be treated may be the substrate "M", on which a pre-treatment has been performed. Line widths of the first pattern P1 and the second pattern P2 of the substrate "M" carried into the liquid treatment chamber 400 may be different. For example, a line width of the first pattern P1 may be a first width. A line width of the second pattern P2 may be a second width. The first width may be larger than the second width. For example, the first width may be 69 nm and the second width may be 68.5 nm.

Figure 4:
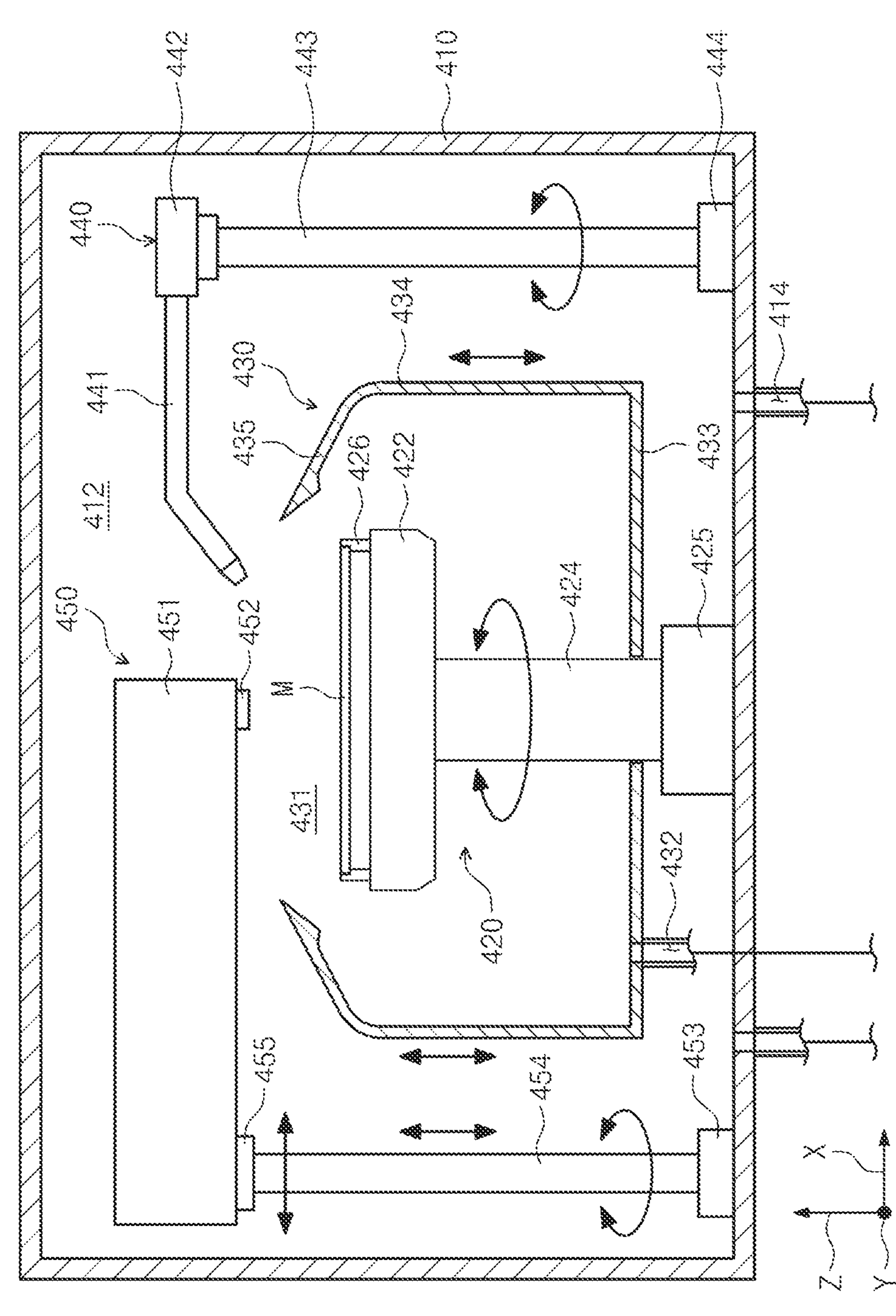
FIG. 4 is a view schematically illustrating an embodiment of the liquid treatment chamber of FIG. 2.
Figure 5:
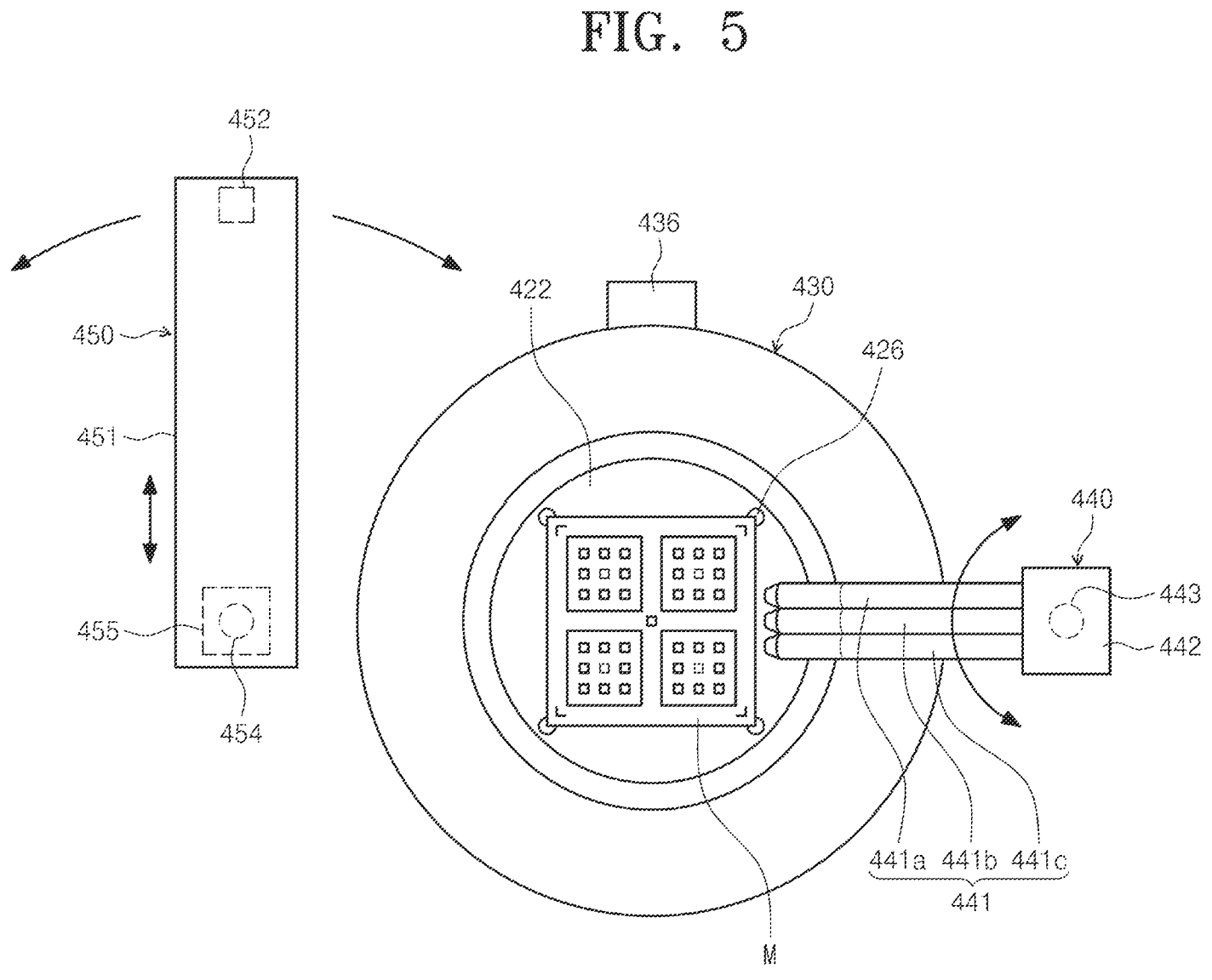

FIG. 4 is a view schematically illustrating an embodiment of the liquid treatment chamber of FIG. 2. FIG. 5 is a view of the liquid treatment chamber of FIG. 4, when viewed from the top. Referring to FIGS. 4 and 5, the liquid treatment chamber 400 may include a housing 410, a support unit 420, a bowl 430, a liquid supply unit 440, and a heating unit 450.

The housing 410 may have an interior space 412. The housing 410 may have an interior space 412, in which the bowl 430 is provided. The housing 410 may have the interior space 412, in which the liquid supply unit 440 and the heating unit 450 are provided. A carrying in/out hole (not illustrated), through which the substrate "M" may be carried in and out, may be formed in the housing 410. The carrying in/out hole may be selectively opened and closed by a door (not illustrated). Furthermore, a material that is highly resistant to chemicals supplied by the liquid supply unit 440 may be coated on an inner wall surface of the housing 410. An exhaust hole (not illustrated) may be formed on a bottom surface of the housing 410. The exhaust hole 414 may be connected to an exhaust member, such as a pump, which may exhaust the interior space 412. Accordingly, fumes that may be generated in the interior space 412 may be exhausted to an outside through the exhaust hole 414.

The support unit 420 may support the substrate "M" in the treatment space 431 of the treatment container 430 that will be described below. The support unit 420 may support the substrate "M". The support unit 420 may rotate the substrate "M".

The support unit 420 may include a chuck 421, a support shaft 424, a driving member 425, and a support pin 426. The support pin 426 may be installed in the chuck 422. The chuck 422 may have a plate shape having a specific thickness. The support shaft 424 may be coupled to a lower side of the chuck 422. The support shaft 424 may be a hollow shaft. Furthermore, the support shaft 424 may be rotated by the driving member 425. For example, the driving member 425 may be a hollow motor. When the driving member 425 rotates the support shaft 424, the chuck 422 coupled to the support shaft 424 may be rotated. The substrate "M" positioned on the support pin 426 installed in the chuck 422 may be rotated together with the chuck 422 when the chuck 422 is rotated.

The support pin 426 may support the substrate "M". The support pin 426 may include a plurality of support pins 426. The plurality of support pins 426 may have a substantially circular shape when viewed from the top. The support pin 426 may have a shape in which a portion corresponding to a corner area of the substrate "M" is recessed downwards when viewed from the top. The support pin 426 may include a first surface that supports a lower side of a corner area of the substrate "M", and a second surface that faces a side of the corner area of the substrate "M" such that movement of the substrate "M" in a lateral direction may be restricted when the substrate "M" is rotated. At least one support pin 426 may be provided. A plurality of support pins 426 may be provided. The number of the support pins 426 may correspond to the number of the corner areas of the substrate "M" having a rectangular shape. The support pins 422 may space a lowers surface of the substrate "M" and an upper surface of the chuck 421 apart from each other by supporting the substrate "M".

The bowl 430 may have a vessel shape, an upper side of which is opened. The bowl 430 may have a treatment space 431, and the substrate "M" may be liquid-treated and heated in the treatment space 431. The bowl 430 may prevent the treatment liquid supplied to the substrate "M" from spattering and being delivered to the housing 410, the liquid supply unit 440, and the heating unit 450.

The bowl 430 may include a bottom part 433, a vertical part 434, and an inclined part 435. The bottom part 433 may have a hole, into which the support shaft 424 may be inserted, when viewed from the top. The vertical part 434 may extend from the bottom part 433 along the third direction "Z". The inclined part 435 may extend in a direction that faces the substrate "M" supported by the support unit 420. The inclined part 435 may extend to be inclined upwards from the vertical part 434. The inclined part 435 may extend to be inclined upwards from the vertical part 434 in a direction that faces the substrate "M". A discharge hole 432, through which the treatment liquid supplied by the liquid supply unit 440 may be discharged to the outside, may be formed in the bottom part 433. Furthermore, the bowl 430 may be coupled to an elevation member 436 such that a location thereof is changed along the third direction "Z". The elevation member 436 may be a driving device that moves the bowl 430 upwards and downwards. The elevation member 436 may move the bowl 430 upwards while the substrate "M" is liquid-treated and/or heated, and may move the bowl 430 downwards when the substrate "M" is carried into the interior space 412 or the substrate "M" is carried out of the interior space 412.

The liquid supply unit 440 may supply the treatment liquid for liquid-treating the substrate "M". The liquid supply unit 440 may supply the treatment liquid to the substrate "M" supported by the support unit 420. The treatment liquid may be an etching liquid and a rinsing liquid. The etching liquid may be a chemical. The etching liquid may etch the patterns formed on the substrate "M". The etching liquid also may be called etchant. The rinsing liquid may clean the substrate "M". The rinsing liquid may be a known chemical.

The liquid supply unit 440 may include a nozzle 441, a fixed body 442, a rotary shaft 443, and a rotary member 444.

The nozzle 411 may supply the treatment liquid to the substrate "M" supported by the support unit 420. One end of the nozzle 411 may be coupled to the fixed body 442, and an opposite end thereof may extend in a direction that faces the substrate "M" from the fixed body 442. The nozzle 411 may extend from the fixed body 442 along the first direction "X". The opposite end of the nozzle 411 may be bent at a specific angle in a direction that faces the substrate "M" supported by the support unit 420 to extend.

The nozzle 411 may include a first nozzle 411*a*, a second nozzle 411*b*, and a third nozzle 411*c*. Any one of the first nozzle 411*a*, the second nozzle 411*b*, and the third nozzle 411*c* may supply, among in the above-described treatment liquids, the chemical "C". Another one of the first nozzle 411*a*, the second nozzle 411*b*, and the third nozzle 411*c* may supply, among in the above-described treatment liquids, the rinsing liquid "R". Furthermore, still another one of the first nozzle 411*a*, the second nozzle 411*b*, and the third nozzle 411*c* may supply a different kind of chemical "C"1 from the chemical "C" supplied by the any one of the first nozzle 411*a*, the second nozzle 411*b*, and the third nozzle 411*c*.

The fixed body 442 may support the nozzle 441. The fixed body 442 may fix the nozzle 441. The fixed body 442 may be coupled to the rotary shaft 443 that is rotated about the third direction "Z" by the rotary member 444. When the rotary member 444 rotates the rotary shaft 443, the fixed body 442 may be rotated about the third direction "Z". Accordingly, a discharge hole of the nozzle 441 may be moved between a liquid supply location that is a location, at which the treatment liquid is supplied to the substrate "M", and a standby location that is a location, at which the treatment liquid is not supplied to the substrate "M".

The heating unit 450 may beat the substrate "M". The heating unit 450 may beat a partial area of the substrate "M". The heating unit 450 may beat the substrate "M", to which the chemical "M" is supplied such that a liquid film is formed. The heating unit 450 may beat the patterns formed on the substrate "M". The heating unit 450 may beat some of the patterns formed on the substrate "M". The heating unit 450 may beat any one of the first pattern P1 and the second pattern P2. For example, the heating unit 450 may beat, among the first pattern P1 and the second pattern P2, the second pattern P2.

The heating unit 450 may include a body 451, a driver 453, a shaft 454, a movement member 455, a laser module 460, an image module 470, and an optical module 480.

The body 451 may be a container having an installation space in an interior thereof. The laser module 460, the image module 470, and the optical module 480, which will be described below, may be installed in the body 451. Furthermore, the body 451 may include an irradiation end 452. The laser light "L" irradiated by the laser module 460 that will be described below may be irradiated to the substrate "M" through the irradiation end 452. Furthermore, the light irradiated by a lighting member 472 that will be described below may be provided through the irradiation end 452. Furthermore, an image of an image acquiring member 471 that will be described below may be captured through the irradiation end 452.

The driver 453 may be a motor. The driver 453 may be connected to the shaft 454. Furthermore, the shaft 454 may be connected to the body 451. The shaft 454 may be connected to the body 451 by a medium of the movement member 455. The driver 453 may rotate the shaft 454. When the shaft 454 is rotated, the body 451 may be rotated. Accordingly, a location of the irradiation end 452 of the body 451 may be changed. For example, a location of the irradiation end 452 may be changed while the third direction "Z" is taken as a rotation axis thereof. When viewed from the top, a center of the irradiation end 452 may be moved while drawing an arc about the shaft 454. That is, the heating unit 450 may be swung about a center axis of the shaft 454. When viewed from the top, the irradiation end 452 may be moved such that a center thereof passes through the center of the substrate supported by the support unit 420. The irradiation end 452 may be moved between a heating location, at which the laser light "L" is irradiated to the substrate "M", and a standby location that is a location, the substrate "M" stands by when the substrate "M" is not heated. Furthermore, the driver 453 may move the shaft 454 in the upward/downward direction. That is, the drive 453 may change the location of the irradiation end 452 in the upward/downward direction. Furthermore, a plurality of drivers 453 may be provided, and any one of them may be provided as a rotation motor that rotates the shaft 454 and another one of them may be provided as a linear motor that moves the shaft 454 in the upward/downward direction.

The movement member 455 may be provided between the shaft 454 and the body 451. The movement member 455 may be an LM guide. The movement member 455 may move the body 451 in a lateral direction. The movement member 455 may move the body 451 in the first direction "X" and/or the second direction "Y". A location of the irradiation end 452 of the heating unit 450 may be variously changed by the movement member 455 and the driver 453.

Figure 6:
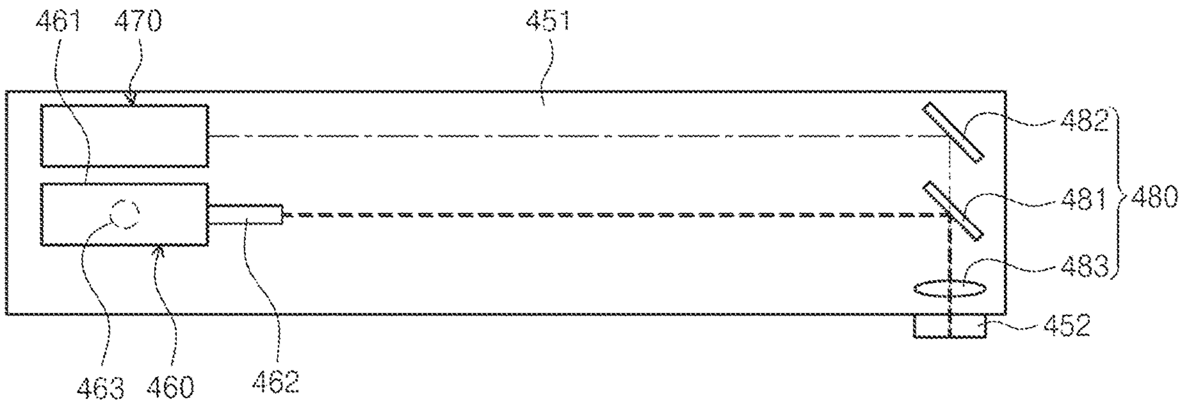
FIG. 6 is a view illustrating appearances of a body of a heating unit of FIG. 4, a laser module, an image module, and an optical module.
Figure 7:
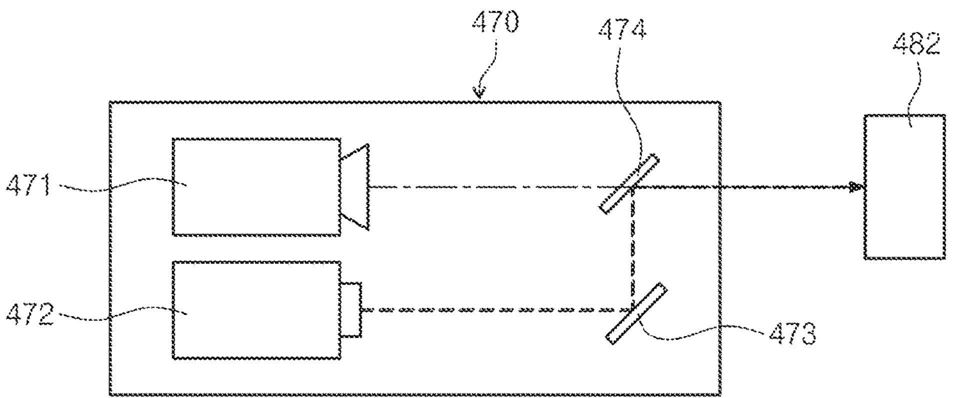
FIG. 7 is a view of the image module of FIG. 6, when viewed from the top.

FIG. 6 is a view illustrating appearances of a body of the heating unit of FIG. 4, the laser module, the image module, and the optical module. FIG. 7 is a view of the image module of FIG. 6, when viewed from the top.

Referring to FIGS. 6 and 7, a laser irradiating part 461, a beam expander 462, and a tiling member 463 may be installed in the body 451. Furthermore, the image module 470 may be installed in the body 451. Furthermore, the optical module 480 may be installed in the body 451.

The laser module 460 may include the laser irradiating part 461, the beam expander 462, and the tilting member 463. The laser irradiating part 461 may irradiate the laser light "L". The laser irradiating part 461 may irradiate the laser light "L" having straightness. A shape and a profile of the laser light "L" irradiated by the laser irradiating part 461 may be adjusted by the beam expander 462. For example, a diameter of the laser light "L" irradiated by the laser irradiating part 461 may be adjusted by the beam expander 462. The diameter of the laser light "L" irradiated by the laser irradiating part 461 may be increased or decreased by the beam expander 462.

The tilting member 463 may tilt an irradiation direction of the laser light "L" irradiated by the laser irradiation part 461. For example, the tilting member 463 may tilt the irradiation direction of the laser light "L" irradiated by the laser irradiation part 461 by rotating the laser irradiating part 461 about one axis. The tilting member 463 may include a motor.

The image module 470 may monitor the laser light "L" irradiated by the laser irradiating part 461. The image module 470 may include an image acquiring member 471, a lighting member 472, a first reflection plate 473, and a second reflection plate 474. The image acquiring member 471 may acquire an image of the substrate "M" and/or a coordinate 491 of an error identifying unit 490, which will be described below. The image acquiring member 471 may be a camera. The image acquiring member 471 may be a vision device. The image acquiring member 471 may acquire an image including a point, to which the laser light "L" irradiated by the laser irradiating part 461 is irradiated.

The lighting member 472 may provide light such that the image may be easily acquired by the image acquiring member 471. The light provided by the lighting member 472 may be reflected sequentially along the first reflection plate 473 and the second reflection plate 474.

The optical module 480 may be configured such that an irradiation direction of the laser light "L" irradiated by the laser irradiating part 461, a photographing direction, in which the image acquiring member 471 acquires the image, and an irradiation direction of the light provided by the lighting member 472 may be on the same axis when viewed from the top. The lighting member 472 may deliver the light to an area, in which the laser light "L" is irradiated by the optical module 480. Furthermore, the image acquiring member 471 may acquire an image, such as an image/picture for an area, to which the laser light "L" is irradiated, in real time. The optical module 480 may include a first reflection member 481, a second reflection member 482, and a lens 483.

The first reflection member 481 may change an irradiation direction of the laser light "L" irradiated by the laser irradiation part 461. For example, the first reflection member 481 may change the irradiation direction of the laser light "L" irradiated horizontally to a downward direction. Furthermore, the laser light "L" refracted by the first reflection member 481 may sequentially pass through the lens 483 and the irradiation end 452 and may be delivered to the substrate "M" that is to be treated or the monitoring target 491 that will be described below.

The second reflection member 482 may change a photographing direction of the image acquiring member 471. For example, the second reflection member 482 may change the photographing direction of the image acquiring member 471, which is a horizontal direction, to a vertically downward direction. Furthermore, the second reflection member 482 may change the irradiation direction of the light of the lighting member 472, which is delivered sequentially via the first reflection plate 473 and the second reflection plate 474 from the horizontal direction to a vertically downward direction.

Furthermore, the first reflection member 481 and the second reflection member 482 may be provided at the same location when viewed from the top. Furthermore, the second reflection member 482 may be disposed on an upper side of the first reflection member 481. Furthermore, the first reflection member 481 and the second reflection member 482 may be tilted at the same angle.

Figure 8:
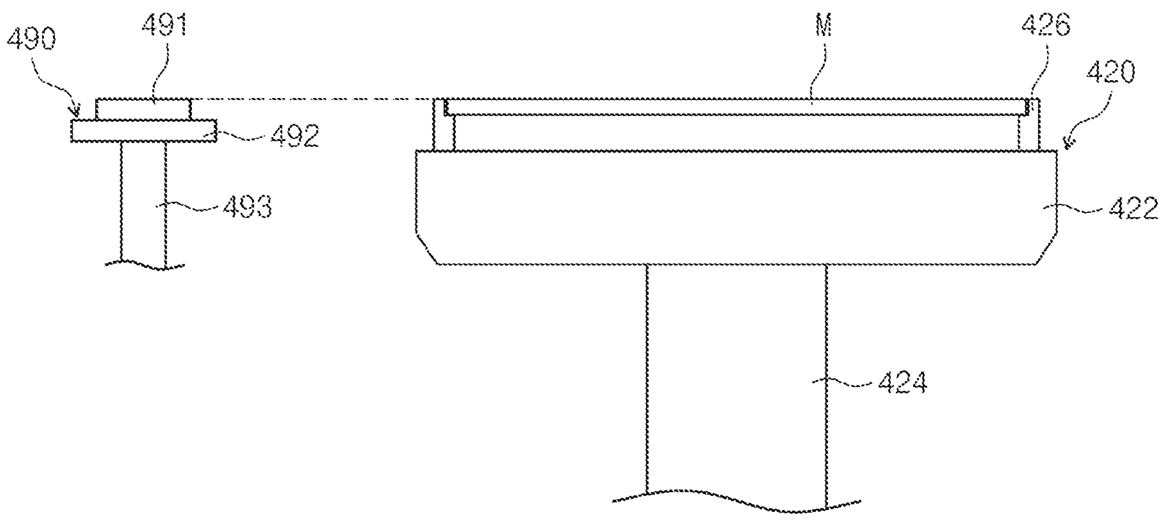
FIG. 8 is a view illustrating an error identifying unit of the liquid treatment chamber of FIG. 4, and the support unit.
Figure 9:
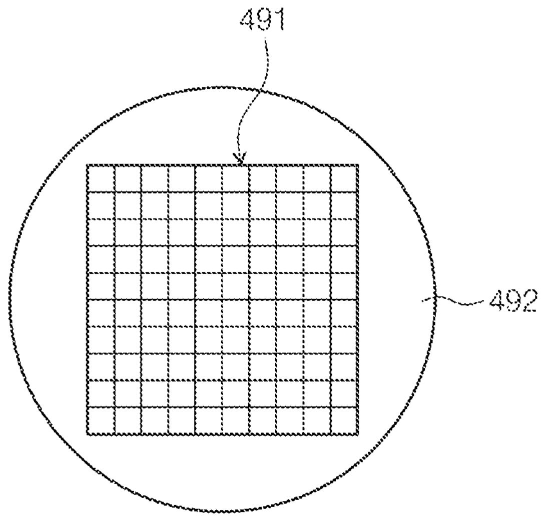
FIG. 9 is a view of an error identifying unit of FIG. 8, when viewed from the top.

FIG. 8 is a view illustrating the error identifying unit of the liquid treatment chamber of FIG. 4, and the support unit. FIG. 9 is a view of the error identifying unit of FIG. 8, when viewed from the top.

Referring to FIGS. 8 and 9, the error identifying unit 490 may identify whether an error is generated between an irradiation location of the laser light "L" and a preset target location TP. For example, the error identifying unit 490 may be provided in the interior space 412. Furthermore, the error identifying unit 490 may be installed in an area on a lower side of the irradiation end 452 when the irradiation end 452 is located at the above-described standby location. The error identifying unit 490 may include a coordinate system 491, a plate 492, and a support frame 493.

The coordinate system 491 also may be called a global coordinate. A preset target location TP may be marked on the coordinate system 491. Furthermore, the coordinate system 491 may include scales to identify an error between the target location TP and the irradiation location, at which the laser "L" is irradiated. Furthermore, the coordinate system 491 may be installed on the plate 492. The plate 492 may be supported by the support frame 493. A height of the coordinate system 491, which is determined by the plate 492 and the support frame 493, may be the same as that of the substrate "M" supported by the support unit 420. For example, a height from a bottom surface of the housing 410 to an upper surface of the coordinate system 491 may be the same as a height from the bottom surface of the housing 410 to an upper surface of the substrate "M" supported by the support unit 420. This is for causing the height of the irradiation end 452 when an error is identified by using the error identifying unit 490 and the height of the irradiation end 452 when the substrate "M" is heated to coincide with each other. When the irradiation direction of the laser light "L" irradiated by the laser irradiating part 461 is distorted with respect to the third direction "Z" even by a small degree, the irradiation location of the laser light "L" may be changed according to the height of the irradiation end 452, and thus, the coordinate system 491 may be provided at the same height as that of the substrate "M" supported by the support unit 420.

Hereinafter, a method for treating a substrate according to an embodiment of the inventive concept will be described in detail. The method for treating the substrate, which will be described below, may be performed by the above-described liquid treatment chamber 400. Furthermore, the above-described controller 30 may control configurations of the liquid treatment chamber 400 such that the method for treating the substrate, which will be described blow, is performed by the liquid treatment chamber 400. For example, the controller 30 may generate a control signal that controls at least any one of the support unit 42, the elevation member 436, the liquid supply unit 440, and the heating unit 450 such that the configurations of the liquid treatment chamber 400 performs the substrate treating method that will be described below.

Figure 10:
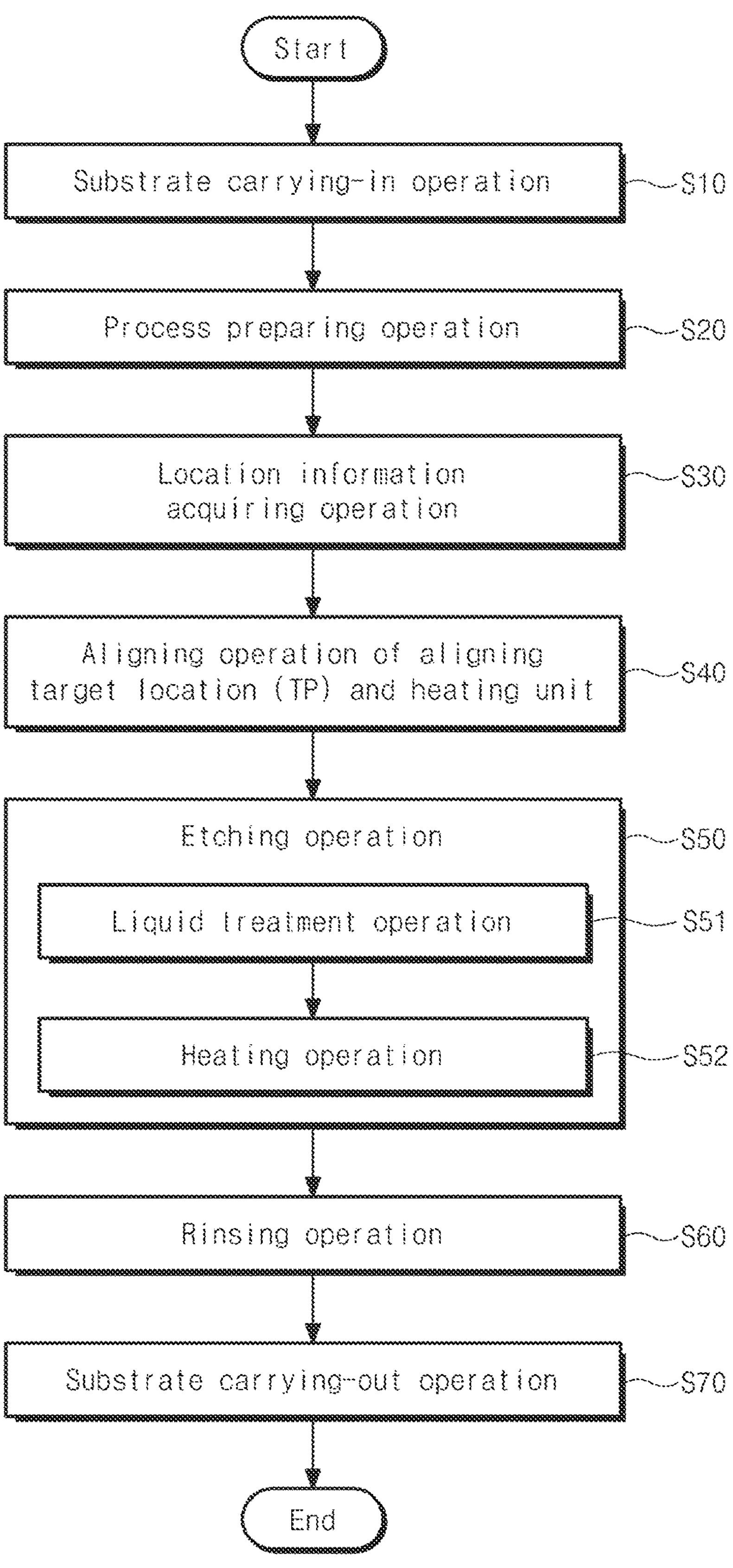
FIG. 10 is a flowchart illustrating the substrate treating method according to an embodiment of the inventive concept.

FIG. 10 is a flowchart illustrating a substrate treating method according to an embodiment of the inventive concept.

Referring to FIG. 10, the substrate treating method according to an embodiment of the inventive concept may include a substrate carrying-in operation S10, a process preparing operation S20, a location information acquring operation S30, an arrangement operation S40, an etching operation S50, a rinsing operation S60, and a substrate carrying-out operation S70.

In the substrate carrying-in operation S10, a door may open a carrying-in/out hole formed in the housing 410. Furthermore, in the substrate carrying-in operation S10, the transfer robot 320 may seat the substrate "M" on the support unit 420. While the transfer robot 320 seats the substrate "M" on the support unit 420, the elevation member 436 may lower a location of the bowl 430.

Figure 11:
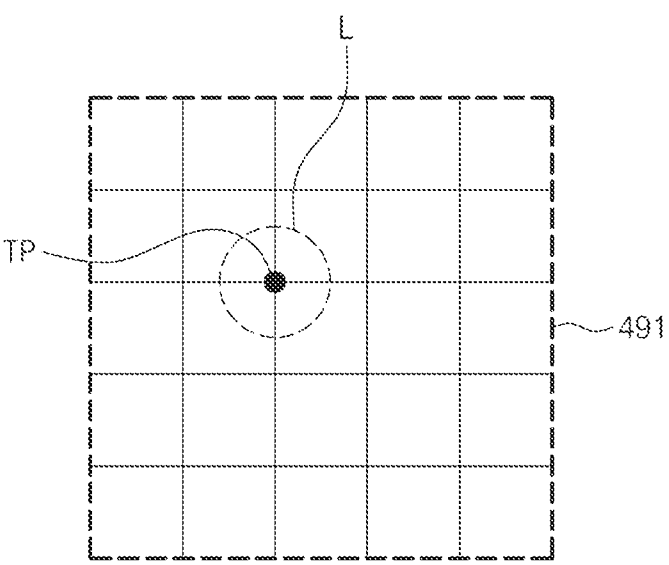
FIG. 11 is a view illustrating an appearance of identifying an error between an irradiation location of laser light and a preset target location, by the substrate treating apparatus in a process preparing operation of FIG. 10.

The process preparing operation S20 may be performed after the substrate "M" has been carried in. In the process preparing operation S20, it may be identified whether there is an error in the irradiation location of the laser light "L" irradiated to the substrate "M". For example, in the process preparing operation S20, the laser module 470 may irradiate laser light "L" for a test to the coordinate system 491 of the error identifying unit 499. When the laser light "L" for a test, which is irradiated by the laser module 470, as illustrated in FIG. 11, coincide with the preset target location TP marked in the coordinate system 491, it may be determined that the laser irradiating part 461 is not distorted and thus the following location information acquiring operation S30 may be performed. Furthermore, the process preparing operation S20, not only it may be identified whether there occurs an error in the irradiation location of the laser light "L" but also the configurations of the liquid treatment chamber 400 may return to an initial state.

In the location information acquiring operation S30, the location of the substrate "M" may be identified. In the location information acquiring operation S30, the locations of the patterns formed in the substrate "M" may be acquired. That is, in the location information acquiring operation S30, information on the location of the substrate "M", to which the chemical "C" and the rinsing liquid "R" are to be supplied, and the target location TP, to which the laser light "L" is to be irradiated, may be acquired. The target location TP may be a location of any one of the first pattern P1 and the second pattern P2. As an example, the target location TP may be a location of the second pattern P2. The location information acquired in the location information acquiring operation S30 may be information on a coordinate of the center of the substrate "M" and a coordinate of the target location TP. For example, the information on the coordinate of the target location TP may be any one of the information on the coordinate of the first pattern P1 and the information on the coordinate of the second pattern P2. For example, the information on the coordinate of the target location TP may be information on a coordinate of the second pattern P2.

Figure 12:
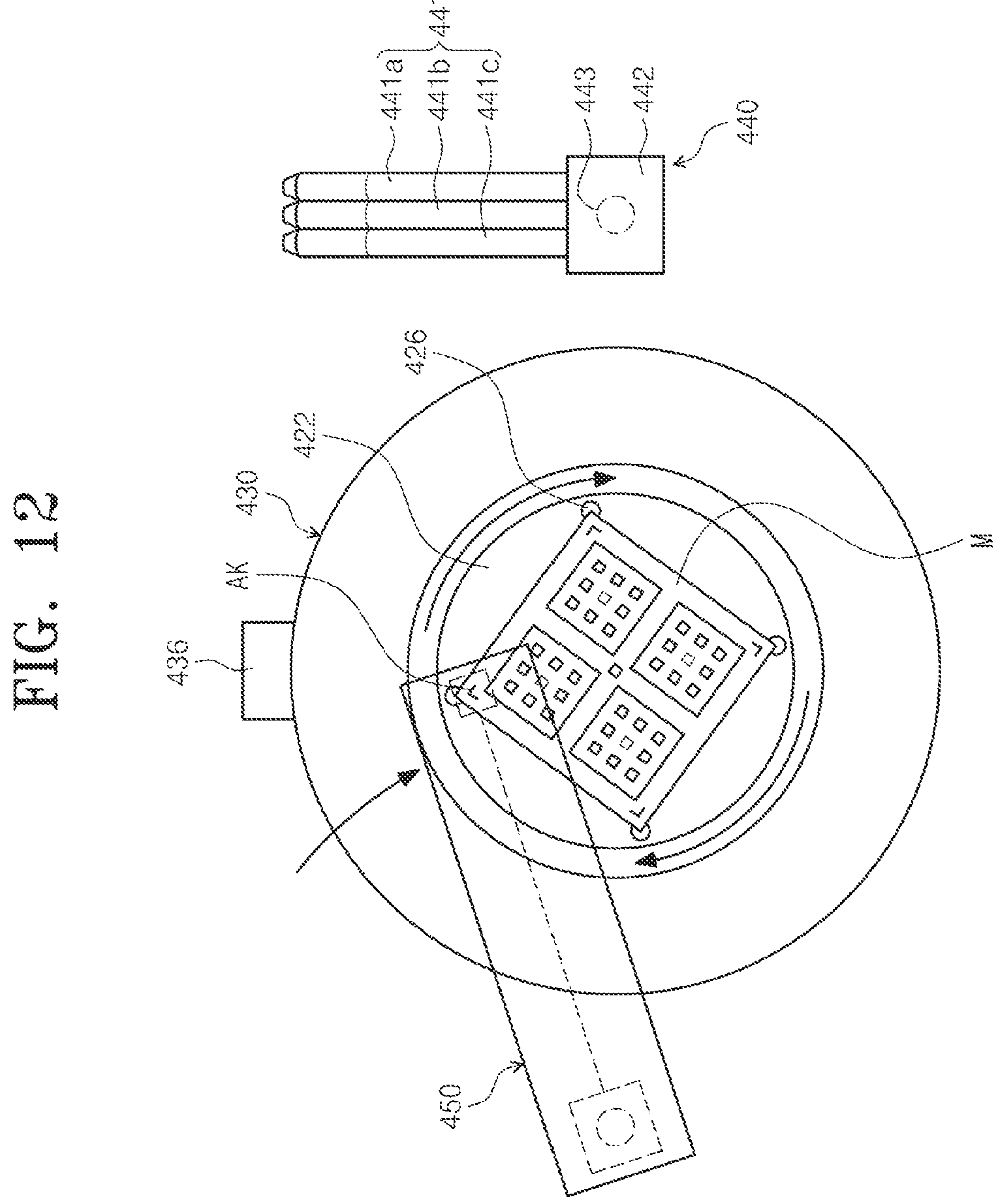
FIG. 12 is a view illustrating an appearance of a substrate treating apparatus that performs a location information acquiring operation of FIG. 10.

In the location information acquiring operation S30, the irradiation end 452 of the heating unit 450 may be moved between the standby location and the heating location, and the support unit 420 may rotate the substrate "M" in one direction. When the irradiation end 452 is moved and the substrate "M" is rotated in one direction, as illustrated in FIG. 12, the irradiation end 452 may coincide with the reference mark AK at a specific time point. Then, the image module 470 may acquire an image for the reference mark AK. Through the image acquired by the image module 470, the controller 30 may acquire a coordinate value for the reference mark AK. Coordinate data on a leftward/rightward width of the substrate "M" and a center point of the substrate "M", and coordinate data on locations of the first pattern P1, the second pattern P2, and the exposure pattern EP in the substrate "M" may be memorized in the controller 30 in advance. The controller 30 may acquire information on the center point of the substrate "M", and the locations of the first pattern P1 and the second pattern P2, based on the acquired coordinate value for the reference mark AK and the above-described data memorized in advance.

In the arrangement operation S40, the irradiation end 452 of the heating unit 450 may be aligned at the target location TP acquired in the location information acquiring operation S30. In the arrangement operation S40, the target location TP and the irradiation end 452 of the heating unit 450 may overlap each other in the upward/downward direction. In the arrangement operation S40, the irradiation end 452 of the heating unit 450 may be located above the target location TP. The arrangement operation S30, the irradiation end 452 of the heating unit 450 may be located in any one of the first pattern P1 and the second pattern P2 on the substrate "M". As an example, in the arrangement operation S40, the irradiation end 452 of the heating unit 450 may be located above the second pattern P2 on the substrate "M".

In the arrangement operation S40, the heating unit 450 may be swung to rotate the support unit 420, on which the substrate "M" is positioned in one direction. That is, the target location TP and the irradiation end 452 of the heating unit 450 may be aligned in the upward/downward direction by swing the irradiation 452 of the heating unit 450 and rotating the substrate "M" in one direction by the support unit 420.

Figure 17:
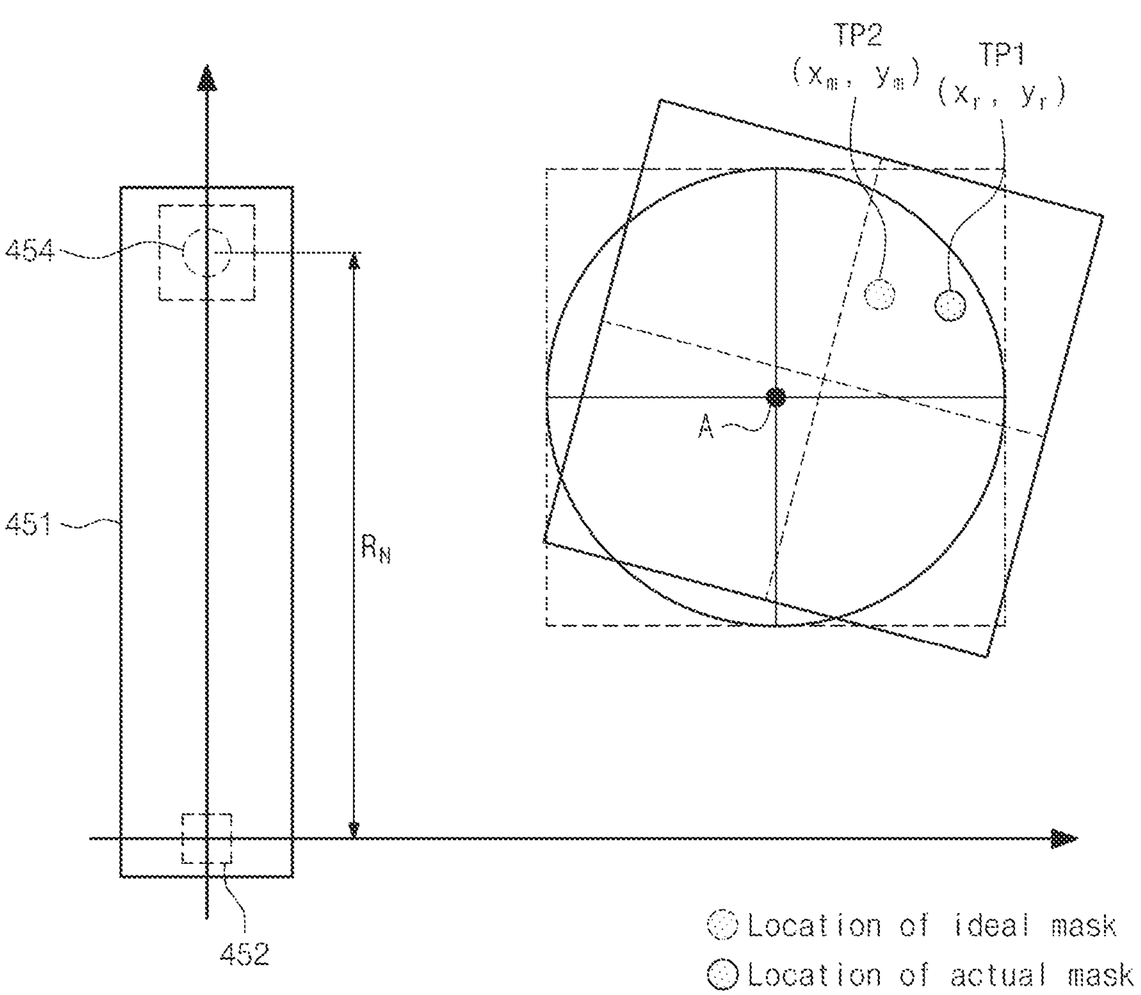
FIG. 17 is a view illustrating an example, in which the actual target location and the ideal target location are different.

Referring to FIG. 17, in a process of seating the substrate "M" by the transfer robot 320, the substrate "M" may not be positioned at a proper location (a location, at which the center of the substrate "M" and the center "A" of the support unit 420 coincide with each other) but may be distorted. In this case, the actual target location TP1 and the ideal target location TP2 may be different, and an error correction for correcting the location difference is necessary. Furthermore, when the substrate "M" is ideally seated at the proper location of the support unit 420, it may be seated while being rotated about the center "A" of the support unit 420 by a specific angle due to an error caused by a mechanical tolerance or a control operation. In this case, the actual target location TP1 and the ideal target location TP2 become different, and an error correction for correcting the location difference is necessary. In the arrangement operation S40, an error may be corrected when the error occurs between the actual target location TP1 and the ideal target location TP2.

The actual target location TP1 and the ideal target location TP2 may be expressed by coordinates with respect to the center "A" of the support unit 420. Furthermore, the ideal target location TP2 may be expressed by a coordinate with respect to the center "A" of the support unit 420 when the substrate "M" is seated on the support unit 420 such that the center of the substrate "M" and the center "A" of the support unit 420 coincide with each other. The center "A" of the support unit 420 may mean a rotation center of the support unit 420.

Hereinafter, referring to FIGS. 16 to 23, a process of correcting an error between the actual target location TP1 and the ideal target location TP2 in the arrangement operation according to an embodiment of the inventive concept will be described in detail.

Figure 16:
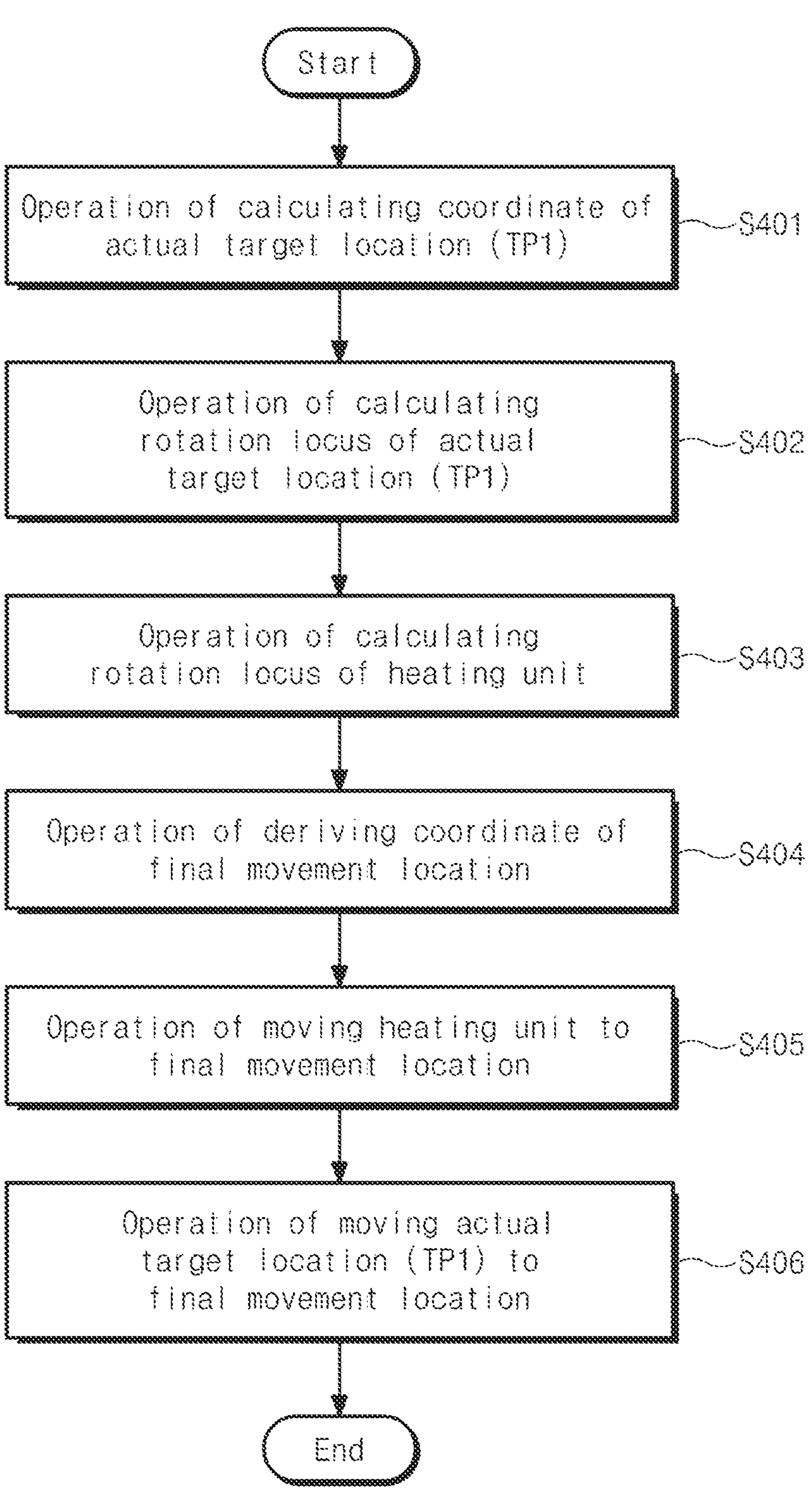
FIG. 16 is a flowchart schematically illustrating a process of correcting an error between an actual target location TP1 and an ideal target location TP2 in the arrangement operation of FIG. 10.

FIG. 16 is a flowchart schematically illustrating a process of correcting an error between the actual target location TP1 and the ideal target location TP2 in the arrangement operation. Referring to FIG. 16, the arrangement operation S40 may include an operation S401 of calculating a coordinate of the actual target location, an operation S402 of calculating a rotation locus of the actual target location, an operation S403 of calculating a rotation locus of the heating unit, an operation S404 of moving the heating unit to a final movement location, an operation S405 of moving the heating unit to the final movement location, and an operation, and an operation S406 of moving the actual target location to the final movement location.

Figure 18:
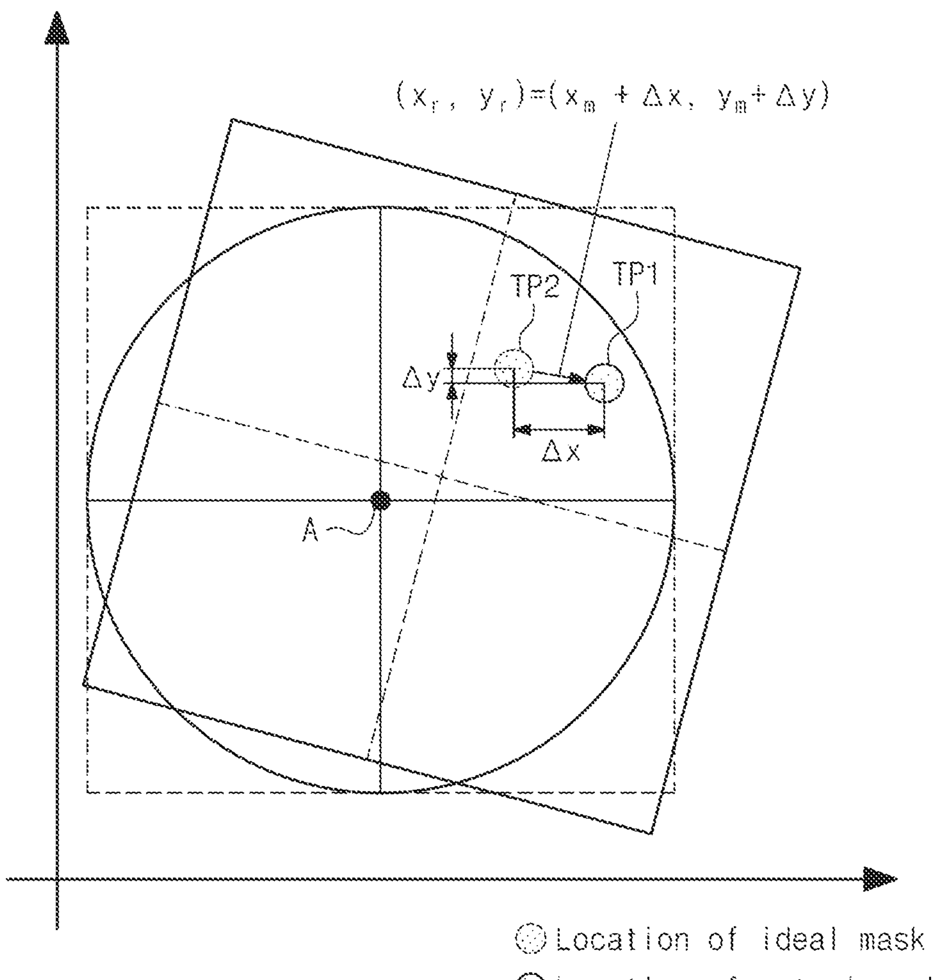
FIG. 18 is a view schematically illustrating a process of performing an operation of calculating a coordinate of the actual target location of FIG. 16.

FIG. 18 is a view schematically illustrating a process of performing the S401 operation of calculating a coordinate of the actual target location of FIG. 16. The actual target location TP1 and the ideal target location TP2 may be coordinates on a coordinate system, in which the center "A" of the support unit 420 is located at (0,0). The ideal target location TP2 may be a coordinate that is input to the controller 30 in advance. Referring to FIG. 18, the coordinate of the actual target location TP1 may be expressed by $(x_r, y_r)$ and the coordinate of the ideal target location TP2 may be expressed by (xm, ym). In the operation S401 of calculating a coordinate of the actual target location, the coordinate of the actual target location TP1 may be calculated. The coordinate of the actual target location may be calculated by applying an error compensation value $(\Delta x, \Delta y)$ to the coordinate of the ideal target location TP2. The coordinate of the actual target location TP1 may be calculated by the image acquiring member 471. The error compensation value $(\Delta x, \Delta y)$ may be calculated by the image acquiring member 471.

Figure 19:
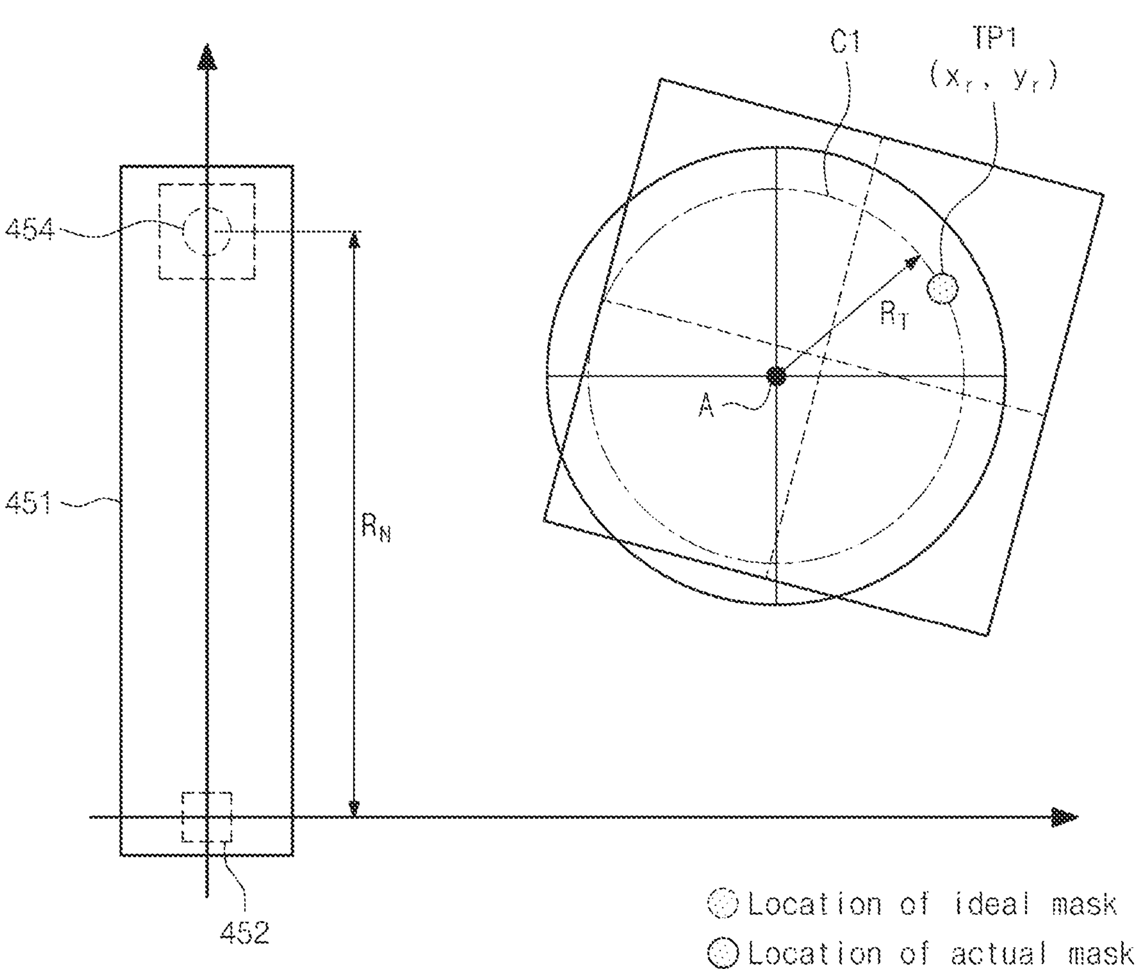
FIG. 19 is a view schematically illustrating a process of performing an operation of calculating a rotation locus of the actual target location of FIG. 16.

FIG. 19 is a view schematically illustrating a process of performing the operation S402 of calculating the rotation locus of the actual target location of FIG. 16. Referring to FIG. 19, in the operation S402 of calculating the rotation locus of the actual target location, an imaginary circle, a radius of which is a distance RT between the calculated coordinate $(x_r, y_r)$ of the actual target location TP1 and the center "A" of the support unit 420. The circle, the radius of which is the distance RT may be a rotation locus, in which the target location TP1 is rotated about the center "A" of the support unit 420.

Figure 20:
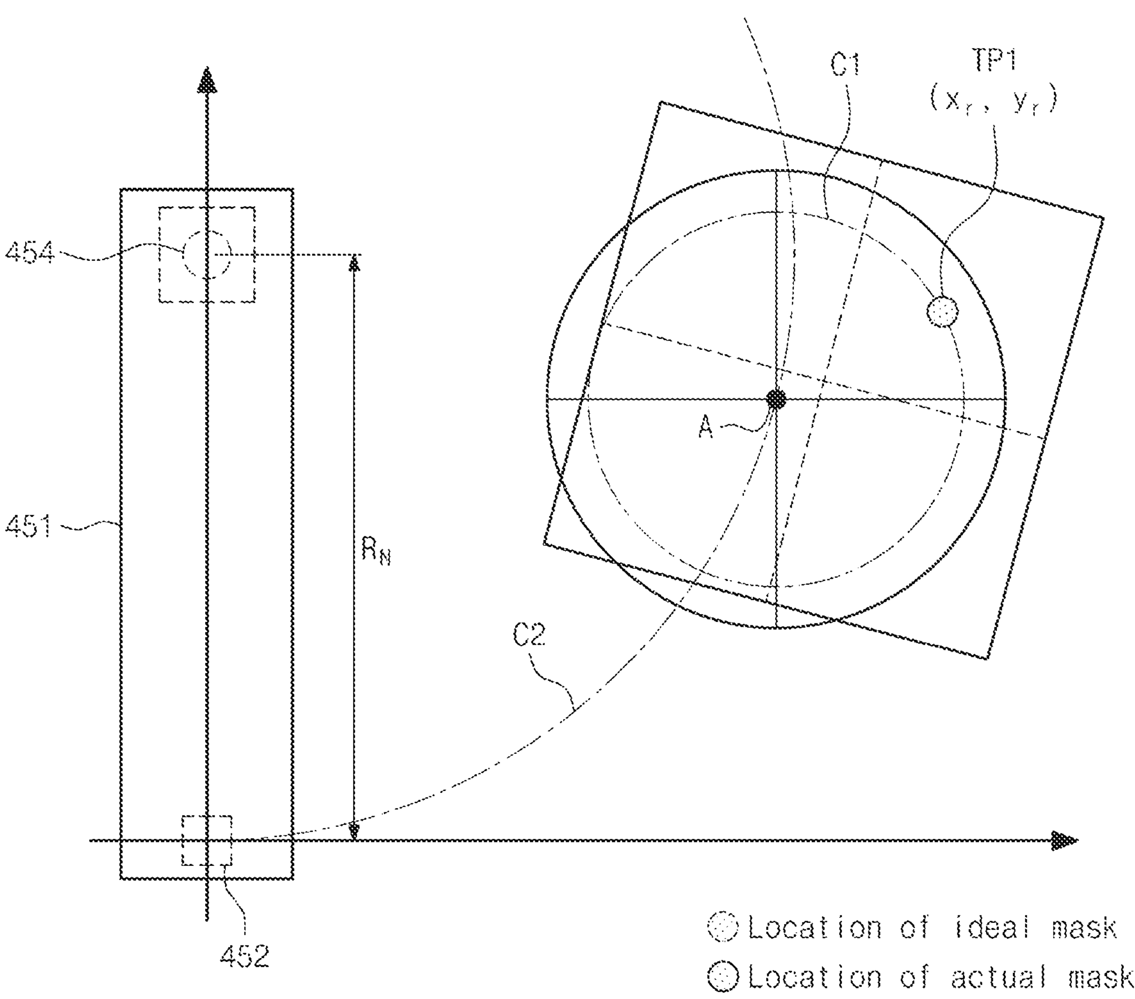
FIG. 20 is a view schematically illustrating a process of performing an operation of calculating a rotation locus of the heating unit of FIG. 16.

FIG. 20 is a view schematically illustrating a process of performing the operation S403 of calculating the rotation locus of the heating unit of FIG. 16. Referring to FIG. 20, in the operation S403 of calculating the rotation locus of the heating unit, an imaginary circle, a radius of which is a length RN of the body 451 of the heating unit 420 in the first direction "X The length RN may be a length between a center axis of the shaft 454 and a center axis of the irradiation end 452. The circle, the radius of which is the length RN, may be a rotation locus, in which the irradiation end 425 of the heating unit 420 is swung or rotated about the shaft 454.

Hereinafter, the rotation locus, the radius of which is the distance RT between the calculated coordinate $(x_r, y_r)$ of the actual target location TP1 and the center "A" of the support unit 420 will be referred to as a first rotation locus C1 and the rotation locus, a radius of which is the length RN of the body 451 of the heating unit 420 in the first direction "X" will be referred to as a second rotation locus C2.

Figure 21:
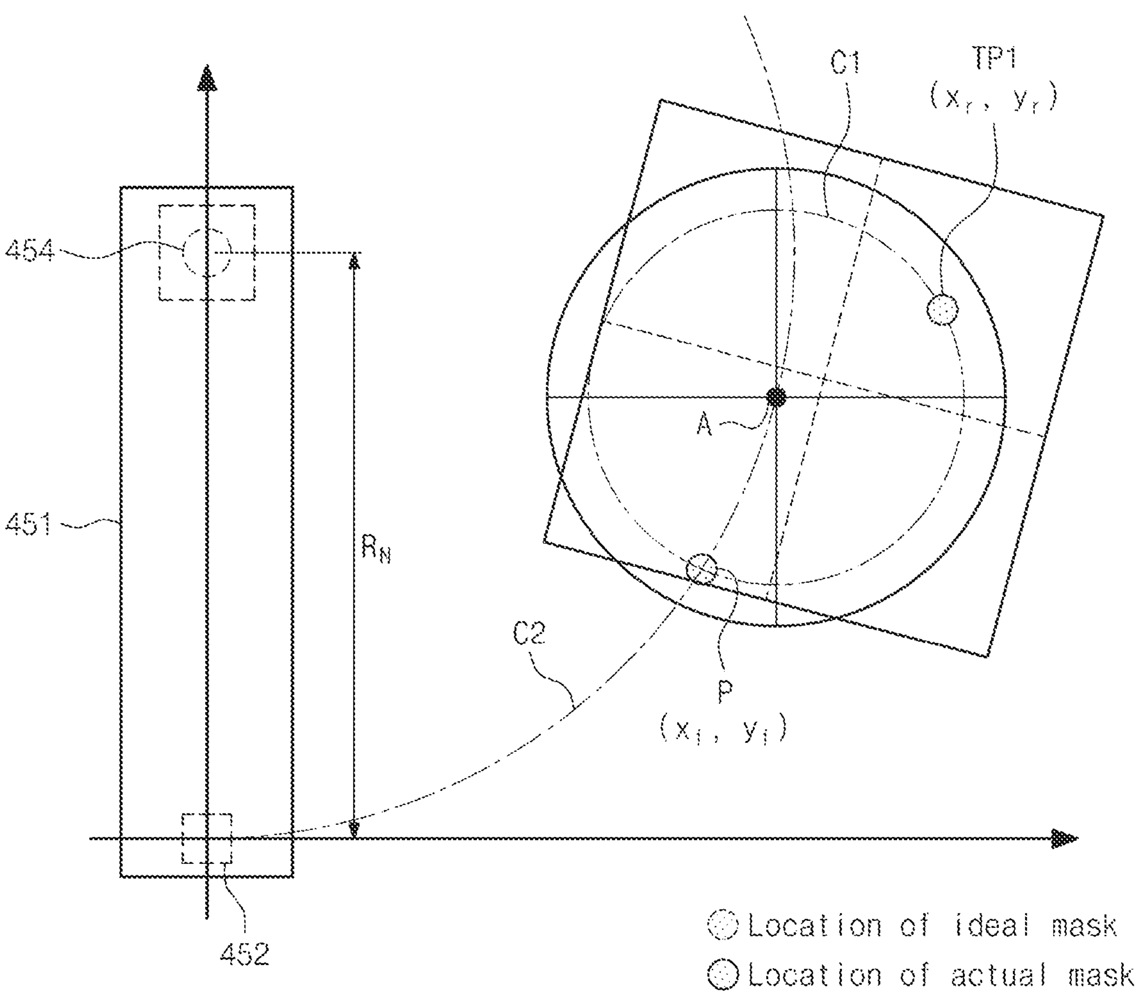
FIG. 21 is a view schematically illustrating a process of performing an operation of deriving a coordinate of a final movement location of FIG. 16.

FIG. 21 is a view schematically illustrating a process of performing the operation S404 of deriving a coordinate of a final movement location of FIG. 16. In the operation S404 of deriving the coordinate of the final movement location, a point, at which the first rotation locus C1 and the second rotation locus C2 meet each other, may be found. In the operation S404 of deriving the coordinate of the final movement location, a coordinate $(x_f, y_f)$ of the point, at which the first rotation locus C1 and the second rotation locus C2 meet each other, may be calculated. The coordinate $(x_f, y_f)$ of the point, at which the first rotation locus C1 and the second rotation locus C2 meet each other, may be performed by the image acquiring member 471. In the operation S404 of deriving the coordinate of the final movement location, a coordinate $(x_f, y_f)$ of the point, at which the first rotation locus C1 and the second rotation locus C2 meet each other, may be determined to be a final movement location "P". Referring to FIG. 21, the first rotation locus and the second rotation locus may meet each other at a plurality of points. In this case, a point of the irradiation end 452, at which the rotation angle is small, may be determined to be the final movement location "P".

Figure 22:
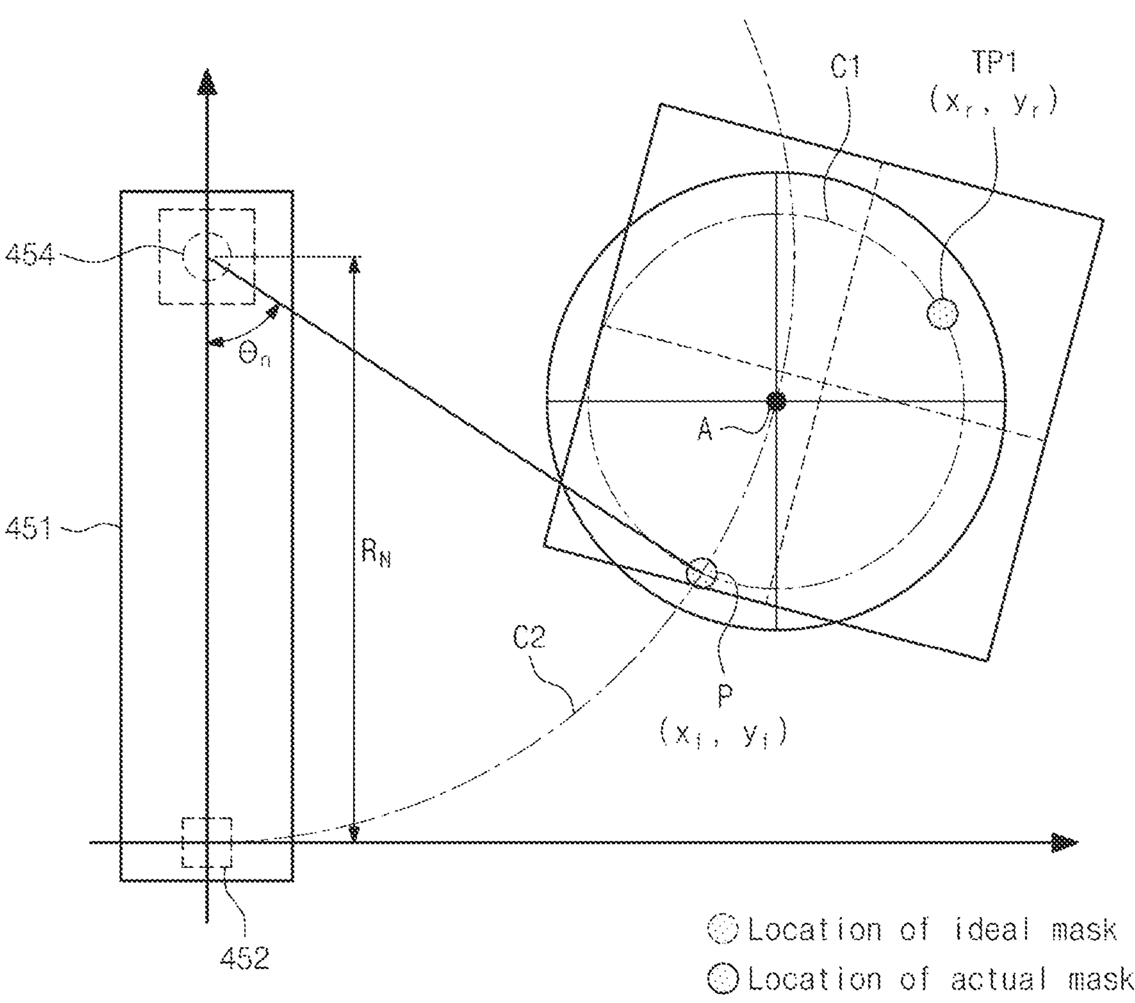
FIG. 22 is a view schematically illustrating a process of performing an operation of moving the heating unit to the final movement location of FIG. 16.

FIG. 22 is a view schematically illustrating a process of performing the operation S405 of moving the heating unit to the final movement location of FIG. 16. In the operation S405 of moving the heating unit to the final movement location, the irradiation end 452 may be moved to the coordinate $(x_f, y_f)$ of the final movement location "P". The controller 30 or the image acquiring member 471 may calculate an angle $(\theta_n)$, at which the irradiation end 452 of the heating unit 450 is moved to the coordinate $(x_f, y_f)$ of the final movement location "P". When the angle $(\theta_n)$, at which the irradiation end 452 of the heating unit 450 is moved to the coordinate $(x_f, y_f)$ of the final movement location "P" is calculated, the heating unit 450 may swung to be moved to the coordinate $(x_f, y_f)$ of the final movement location "P".

Figure 23:
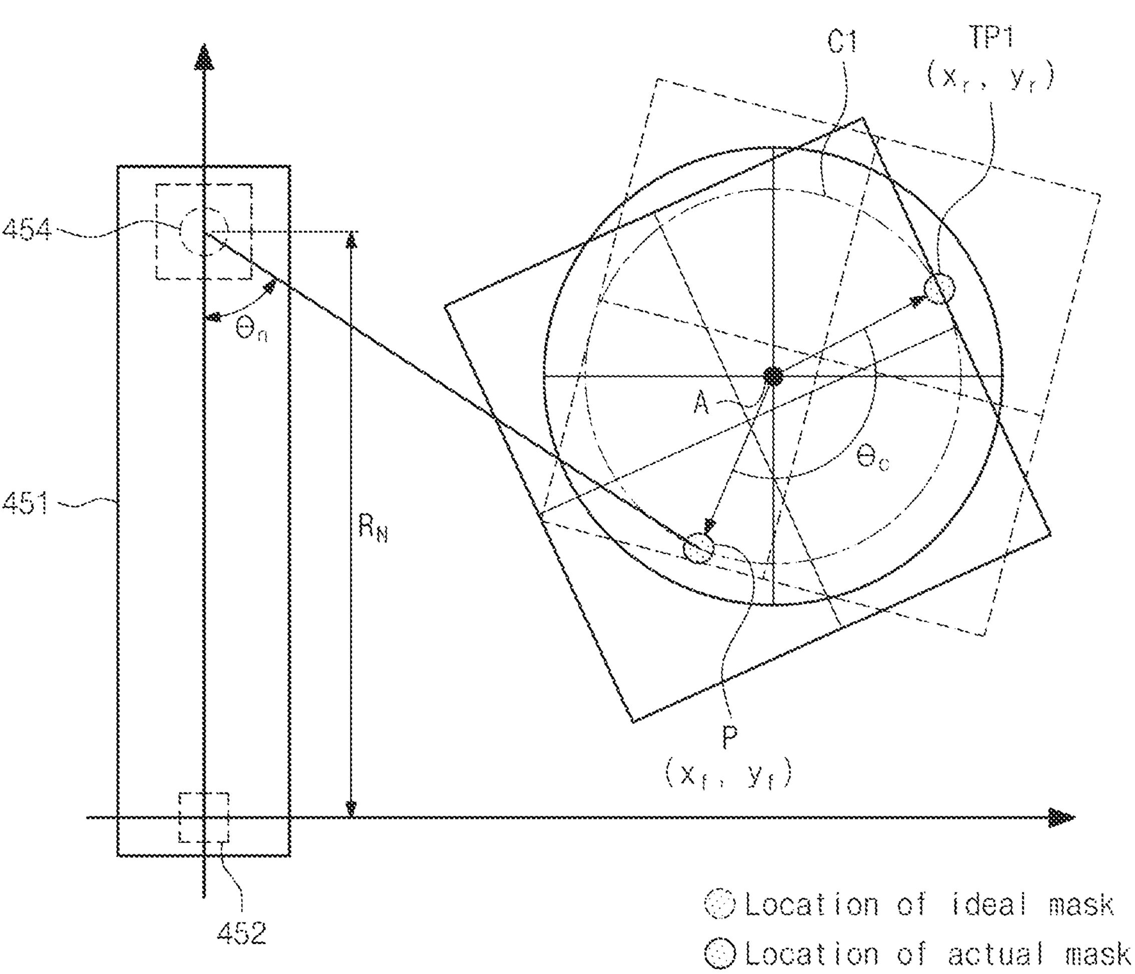
FIG. 23 is a view schematically illustrating a process of performing an operation of moving the actual target location to the final movement location of FIG. 16.

FIG. 23 is a view schematically illustrating a process of performing the operation S406 of moving the actual target location to the final movement location of FIG. 16. In the operation S406 of moving the actual target location to the final movement location, the actual target location TP1 may be moved to the coordinate ($x_f$,$y_f$) of the final movement location "P" by rotating the support unit 420. The controller 30 or the image acquiring member 471 may calculate a rotation angle ($\theta_c$), at which the actual target location TP1 is to be moved to the coordinate ($x_f$,$y_f$) of the final movement location "P". Then, the support unit 420 may be configured to be rotated in the clockwise direction or the counterclockwise direction, and the rotation angle ($\theta_c$) may be selected such that it has an angle of a minimum value. As an example, referring to FIG. 23, the rotation angle ($\theta_c$) may be an angle when the support unit 420 is rotated in the clockwise direction. As the actual target location TP1 is moved to the coordinate ($x_f$,$y_f$) of the final movement location "P", the actual target location TP1 and the irradiation end 452 may be aligned in the upward/downward direction. Accordingly, through the irradiation end 452, the laser light "L" may be precisely irradiated to the actual target location TP1.

In the etching operation S50, the pattern formed on the substrate "M" may be etched. In the etching operation S50, the patterns formed on the substrate "M" may be etched such that the line width of the first pattern P1 and the line width of the second pattern P2 coincide with each other. In the etching operation S50 may be a line width correcting process of correcting the above-described difference between the line widths of the first pattern P1 and the second pattern P2. The etching operation S50 may include a liquid treatment operation S51 and a heating operation S52.

Figure 13:
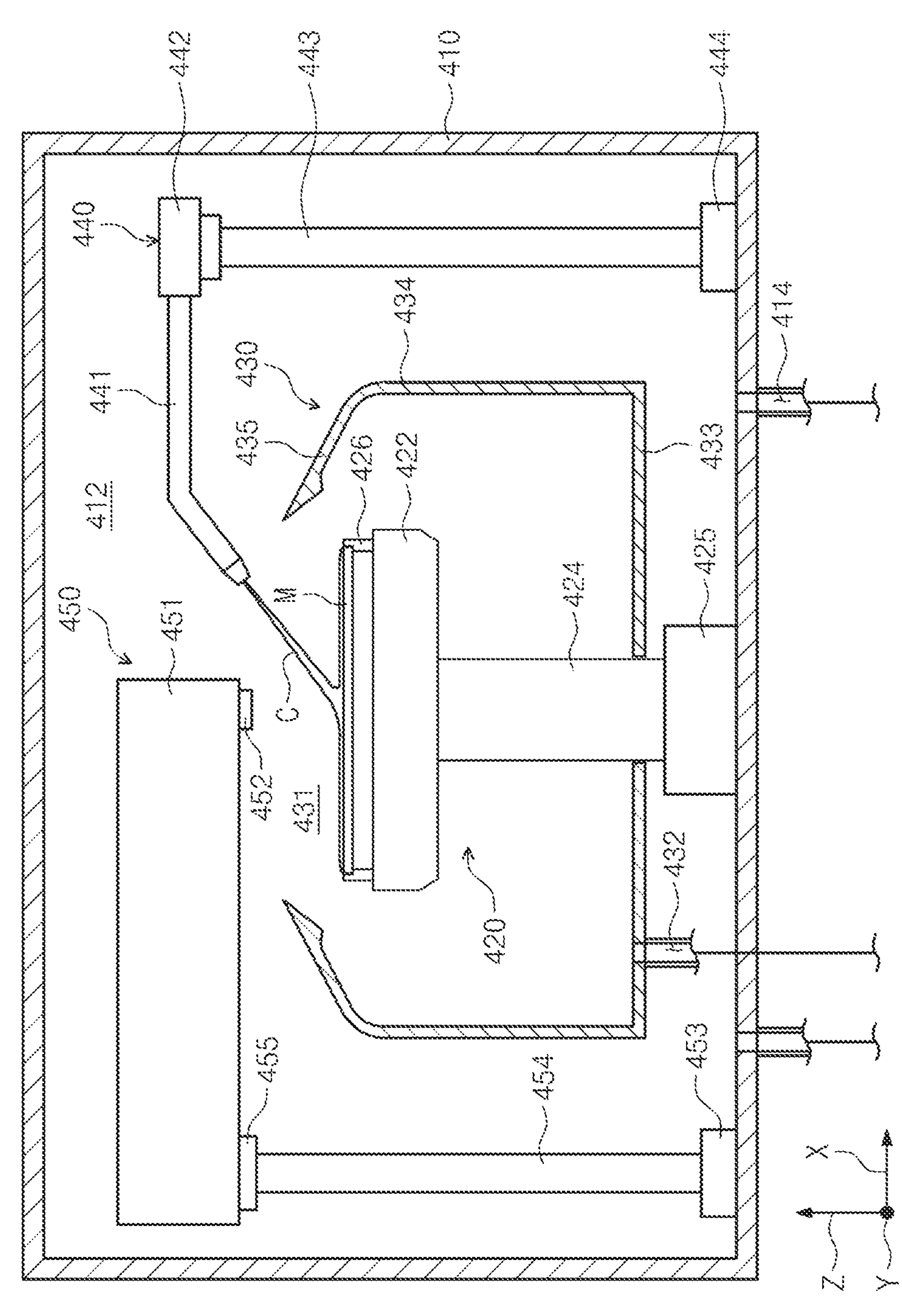
FIG. 13 is a view illustrating an appearance of a substrate treating apparatus that performs a liquid treatment operation of FIG. 10.

The liquid treatment operation S51 may be an operation of supplying the chemical "C" that is etchant to the substrate "M" by the liquid supply unit 440 as illustrated in FIG. 13. In the liquid treating operation S41, the support unit 420 may not rotate the substrate "M". In the following heating operation S52, distortion of the location of the substrate "M" has to be minimized to precisely irradiate the laser light "L" in a specific pattern, and this is because the location of the substrate "M" is distorted when the substrate "M" is rotated. Furthermore, an amount of the chemical "C" supplied in the liquid treatment operation may be large enough such that the chemical supplied onto the substrate "M" forms a puddle. For example, the amount of the chemical supplied in the liquid treatment operation S51 may be large enough such that the chemical "C" covers the entire upper surface of the substrate "M" but does not flow over from the substrate "M" or the amount of the chemical "C" is too large even though the chemical "C" flows over. According to necessities, an etching liquid may be supplied to the entire upper surface of the substrate "M" while the location of the nozzle 441 is changed.

Figure 14:
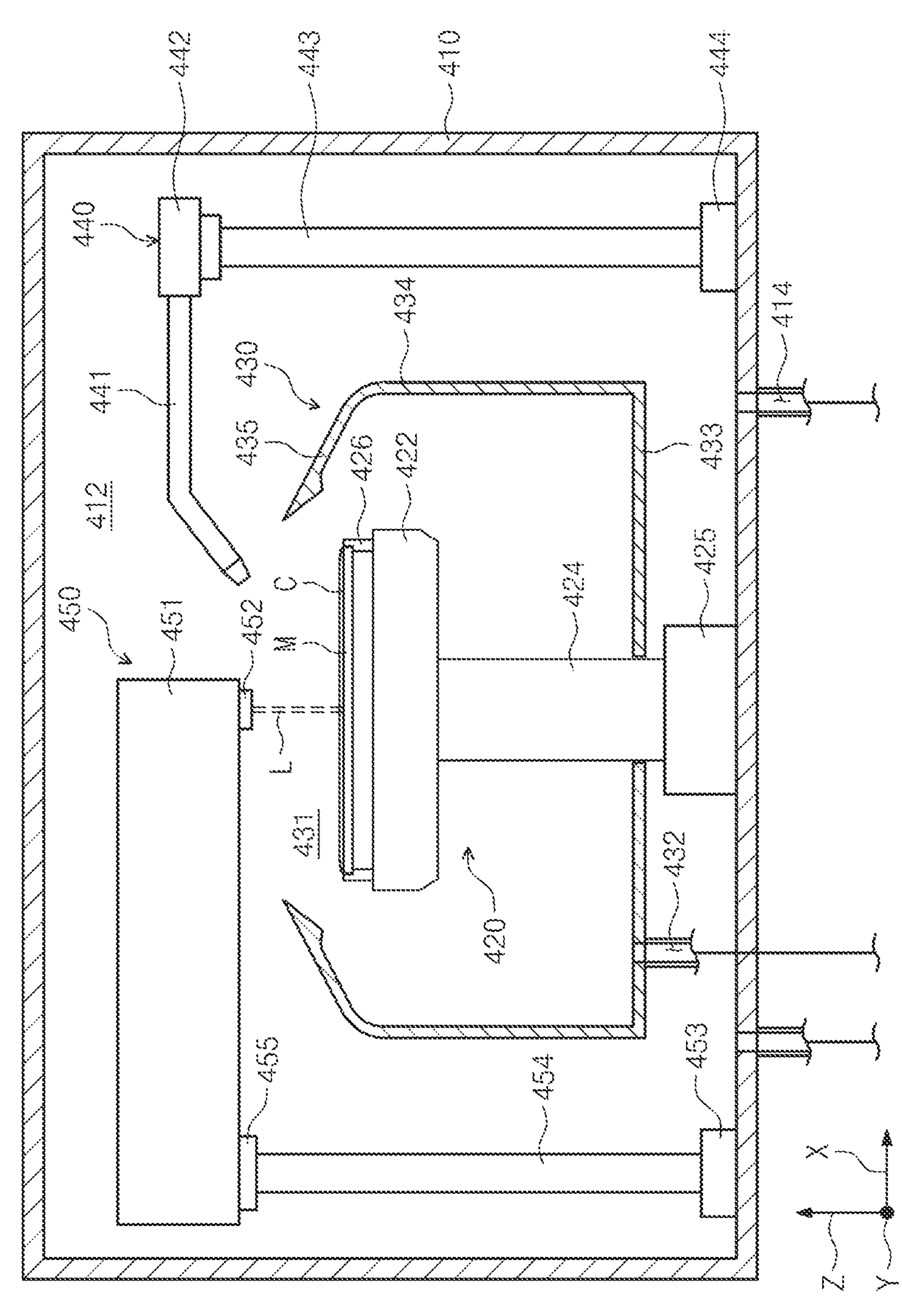
FIG. 14 is a view illustrating an appearance of a substrate treating apparatus that performs a heating operation of FIG. 10.

In the heating operation S52, the substrate "M" may be heated by irradiating the laser light "L" to the substrate "M". In the heating operation S52, as illustrated in FIG. 14, the heating module 460 may beat the substrate "M" by irradiating the laser light "L" top the substrate "M", in which a liquid film is formed as the chemical "C" is supplied. In the heating operation S52, the laser light "L" may be irradiated to a specific area of the substrate "M". A temperature of the specific area, to which the laser light "L" is irradiated, may be increased. Accordingly, an etching degree by the chemical "C" in the area, to which the laser light "L" is irradiated, may be increased. Furthermore, in the heating operation S42, the laser light "L" may be irradiated to any one of the first pattern P1 and the second pattern P2. For example, the laser light "L" may be irradiated to, among the first pattern P1 and the second pattern P2, only the second pattern P2. Accordingly, an etching performance for the second pattern P2 of the chemical "C" is enhanced. Accordingly, the line width of the first pattern P1 may be changed to a target line width (for example, 70 nm) at the first width (for example, 69 nm). Furthermore, the line width of the second pattern P2 may be changed to the target line width (for example, 70 nm) at the second width (for example, 68.5 nm). That is, a deviation of the line width of the pattern formed on the substrate "M" may be minimized by enhancing an etching performance for a partial area of the substrate "M".

Figure 15:
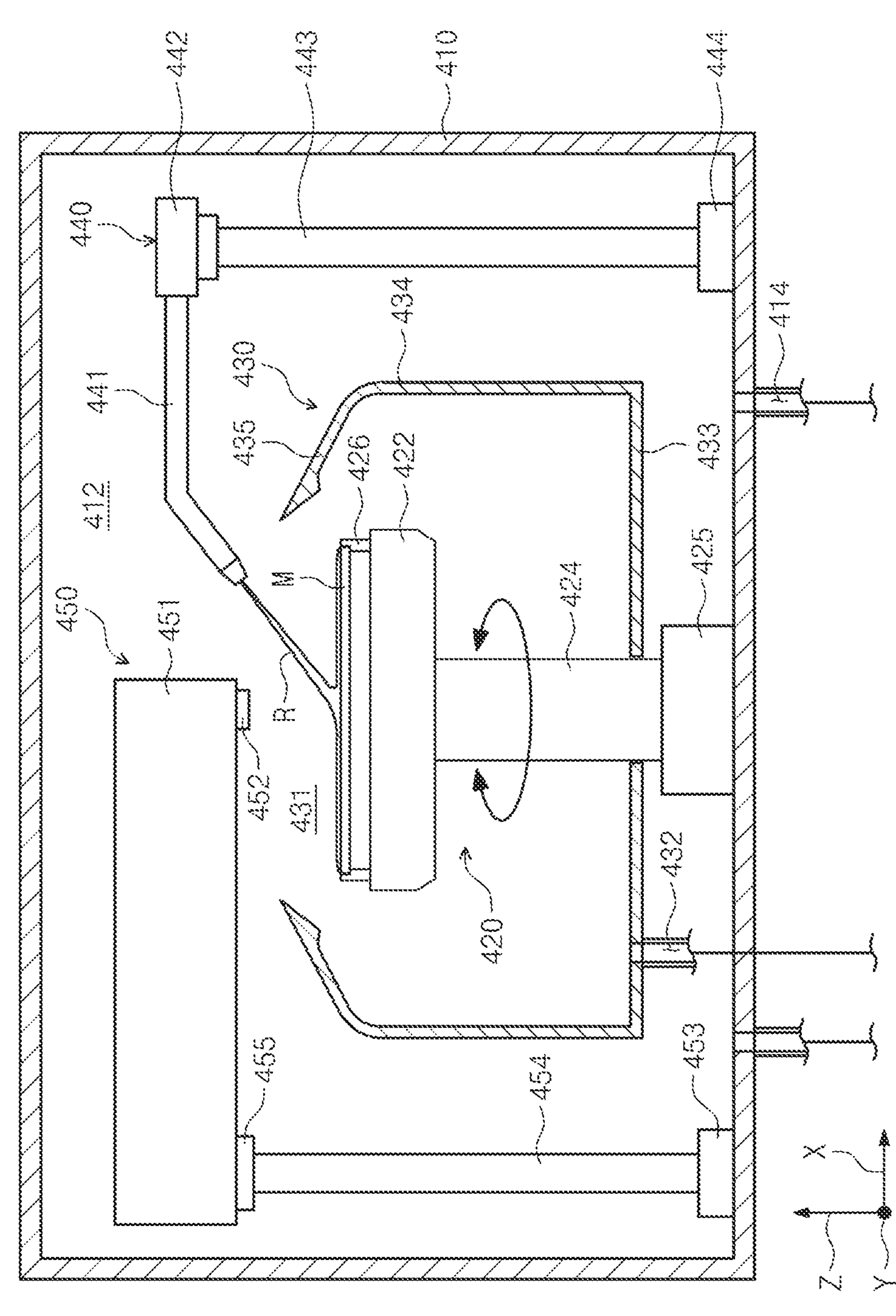
FIG. 15 is a view illustrating an appearance of a substrate treating apparatus that performs a rinsing operation of FIG. 10.

In the rinsing operation S60, process by-products generated in the etching operation S50 may be removed from the substrate "M". In the rinsing operation S60, as illustrated in FIG. 15, the process by-products formed on the substrate "M" may be removed by supplying a rinsing liquid "R" to the rotating substrate "M". According to the necessities, to dry the rinsing liquid "R" that resides on the substrate "M", the support unit 420 may remove the rinsing liquid "R" that resides on the substrate "M" by rotating the substrate "M" at a high speed.

In the substrate carrying-out operation S70, the substrate that has been treated may be carried out from the interior space 412. In the substrate carrying-out operation S70, the door may open a carrying-in/out hole formed in the housing 410. Furthermore, in the substrate carrying-out operation S70, the transfer robot 320 may unload the substrate "M" from the support unit 420, and may carry the unloaded substrate "M out of the interior space 412.

An embodiment of the inventive concept suggests a method of operating the heating unit 450 and the support unit 420 such that a swing stage device using the heating unit 450 that is swung and the support unit 420 that is rotated irradiates the laser light "L" to an precise target location TP. Because a swing locus of the heating unit 450 is restrictive in the swing stage, it cannot be moved to all locations on the substrate "M". Accordingly, when an error occurs between the actual target location TP1 and the ideal target location TP2, the laser light "L" cannot be irradiated to a precise location only through movement of the heating unit 450. However, according to the embodiment of the inventive concept, by using both of swinging of the heating unit 450 and rotation of the support unit 420, the irradiation end 452 of the heating unit 450 may be moved to all locations of the substrate "M", in particular, to the target location. Accordingly, through the irradiation end 452, the laser light "L" may be irradiated to a precise target location.

According to an embodiment of the inventive concept, a substrate may be efficiently treated.

According to an embodiment of the inventive concept, line widths of pattern formed on a substrate may be made uniform.

According to an embodiment of the inventive concept, laser light may be moved to a desired target location on a substrate, and a substrate treating method.

According to an embodiment of the inventive concept, a laser module that is swung and a substrate support unit that is rotated may be used to allow laser light to be precisely irradiated to a target location.

The effects of the embodiments of the inventive concept are not limited to the above-mentioned effects, and the unmentioned effects can be clearly understood by those skilled in the art, to which the embodiments of the inventive concept pertain, from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the present disclosure can be modified and corrected without departing from the scope of the present disclosure that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:

a support unit;

a heating unit comprising:

a body including an irradiation end, from which laser light is irradiated;

a shaft coupled to the body; and a driver configured to supply power to the shaft, a controller configured to control movement of the heating unit, wherein the controller moves the irradiation end of the heating unit to a target location on a substrate by adjusting a rotation angle of the heating unit and a rotation angle of the support unit, wherein the target location includes an ideal target location, at which the target location is located when a center of the substrate and a center of the support unit coincide with each other, and an actual target location, at which the target location is located when the center of the substrate and the center of the support unit do not coincide with each other, wherein the controller calculates an error value between the ideal target location and the actual target location, and wherein the controller calculates a coordinate of the actual target location by applying the calculated error value to the actual target location.

2. The substrate treating apparatus of claim 1, wherein the controller derives an imaginary first circle, a radius of which is a distance between the center of the support unit and the calculated coordinate of the actual target location, and wherein the controller calculates a first rotation locus of the imaginary first circle.

3. The substrate treating apparatus of claim 2, wherein the controller derives an imaginary second circle, a radius of which is a length of the body of the heating unit, and wherein the controller calculates a second rotation locus of the imaginary second circle.

4. The substrate treating apparatus of claim 3, wherein the controller determines a point, at which the first rotation locus and the second rotation locus meet each other, as a final movement location.

5. The substrate treating apparatus of claim 4, wherein a point, at which a rotation angle of the heating unit is small, is determined as the final movement location when the first rotation locus and the second rotation locus meet each other at a plurality of points.

6. The substrate treating apparatus of claim 3, wherein the controller calculates a first rotation angle, by which the irradiation end is moved to the final movement location, and wherein the controller swings the heating unit by the first rotation angle.

7. The substrate treating apparatus of claim 6, wherein the controller calculates a second rotation angle, by which the support unit is to be rotated, to move the actual target location formed on the substrate to the final movement location, and wherein the controller rotates the support unit by the second rotation angle.

8. The substrate treating apparatus of claim 7, wherein the support unit is rotatable in the clockwise direction or the counterclockwise direction, and wherein the second rotation angle is determined by an angle having a minimum vale according to a rotation direction of the support unit.

9. The substrate treating apparatus of claim 1, wherein a first pattern, and a second pattern formed at a location that is different from that of the first pattern are formed on the substrate, and wherein the target location is a location of the second pattern.

10. The substrate treating apparatus of claim 1, wherein the heating unit further comprises a laser module including:

a beam expander configured to adjust a diameter of the laser light; and a tilting member configured to tilt an irradiation direction of the laser light.

11. The substrate treating apparatus of claim 1, wherein the heating unit further comprises an optical module including a first reflection member and a second reflection member arranged such that an irradiation direction of the laser light, a photographing direction of an image acquiring member, and an irradiation direction of a lighting member are coaxial when viewed from above.

12. The substrate treating apparatus of claim 1, wherein the heating unit further comprises an image module including:

an image acquiring member configured to acquire an image of the substrate;

a lighting member; a first reflection plate; and a second reflection plate configured to redirect light toward the substrate.

13. The substrate treating apparatus of claim 1, further comprising an error identifying unit positioned below a standby location of the irradiation end, the error identifying unit including a coordinate system having a preset target location and a height matched to a height of the substrate supported by the support unit.

14. The substrate treating apparatus of claim 1, wherein the support unit comprises a plurality of support pins each having a recessed region shaped to receive a corner of the substrate and to restrict lateral movement during rotation.

15. The substrate treating apparatus of claim 1, wherein the controller is configured to irradiate the laser light only to a second pattern formed on the substrate to accelerate etching of the second pattern relative to a first pattern.

16. The substrate treating apparatus of claim 1, wherein the driver comprises a linear motor configured to move the shaft in an upward or downward direction to adjust a height of the irradiation end.

17. The substrate treating apparatus of claim 1, wherein the controller operates the heating unit to irradiate the laser light while a chemical supplied to the substrate forms a liquid film or puddle covering an upper surface of the substrate.

* * * * *